(12) United States Patent  
Nakagawa et al.

(10) Patent No.: US 7,476,582 B2  
(45) Date of Patent: Jan. 13, 2009

(54) SEMICONDUCTOR DEVICE AND ITS MANUFACTURING METHOD

(75) Inventors: Shin-ichi Nakagawa, Kawasaki (JP); Mitsutera Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 231 days.

(21) Appl. No.: 11/602,246

(22) Filed: Nov. 21, 2006

(65) Prior Publication Data

US 2007/0066004 A1    Mar. 22, 2007

Related U.S. Application Data

(60) Division of application No. 10/423,963, filed on Apr. 28, 2003, now abandoned, which is a continuation of application No. 09/964,592, filed on Sep. 28, 2001, now abandoned.

(30) Foreign Application Priority Data

Sep. 29, 2000   (JP)   ............... 2000-301298

(51) Int. Cl.  
*H01L 21/00*   (2006.01)

(52) U.S. Cl. ............ 438/201; 438/257; 438/264

(58) Field of Classification Search .......... 438/201, 438/257, 264  
See application file for complete search history.

(56) References Cited

U.S. PATENT DOCUMENTS

| 5,034,798 | A |   | 7/1991 | Ohsima |  |
|---|---|---|---|---|---|
| 5,449,634 | A |   | 9/1995 | Inoue |  |
| 5,994,733 | A |   | 11/1999 | Nishioka et al. |  |
| 6,251,729 | B1 |   | 6/2001 | Montree et al. |  |
| 6,259,126 | B1 |   | 7/2001 | Hsu et al. |  |
| 6,278,164 | B1 | * | 8/2001 | Hieda et al. | 257/410 |
| 6,368,923 | B1 | * | 4/2002 | Huang | 438/275 |
| 6,613,621 | B2 | * | 9/2003 | Uh et al. | 438/183 |
| 6,706,579 | B2 | * | 3/2004 | Kasuya | 438/201 |
| 6,873,016 | B2 | * | 3/2005 | Park et al. | 257/350 |
| 7,122,430 | B2 | * | 10/2006 | Sato et al. | 438/257 |
| 7,271,083 | B2 | * | 9/2007 | Tu et al. | 438/597 |
| 2002/0043683 | A1 | * | 4/2002 | Nakagawa et al. | 257/315 |
| 2003/0166322 | A1 | * | 9/2003 | Kasuya | 438/284 |

(Continued)

FOREIGN PATENT DOCUMENTS

EP    0 936 672 A2    8/1999

(Continued)

OTHER PUBLICATIONS

Dec. 30, 2002 European Search Report for corresponding European Application EP 01 12 27 88.

*Primary Examiner*—Laura M Menz  
(74) *Attorney, Agent, or Firm*—Westerman, Hattori, Daniels & Adrian, LLP.

(57) ABSTRACT

A non-volatile semiconductor memory device which simultaneously possesses a non-volatile memory cell region which possesses an isolating insulation film which has been formed selectively within a semiconductor substrate, which also possesses a first electroconductive film (floating gate electrode) via a first gate insulating film which has been formed on the semiconductor substrate surface, and which also possesses a metal film (control gate electrode) via a second gate insulating film which has been formed above said electroconductive film and a peripheral transistor region which possesses a metal film (gate electrode) via a third gate insulating film which has been formed above the semiconductor substrate surface.

3 Claims, 34 Drawing Sheets

U.S. PATENT DOCUMENTS

| | | | |
|---|---|---|---|
| 2004/0070034 A1* | 4/2004 | Park et al. | 257/380 |
| 2004/0075133 A1* | 4/2004 | Nakagawa et al. | 257/314 |
| 2005/0029573 A1* | 2/2005 | Sato et al. | 257/314 |
| 2005/0202606 A1* | 9/2005 | Park et al. | 438/156 |
| 2006/0017115 A1* | 1/2006 | Tu et al. | 257/371 |
| 2006/0097307 A1* | 5/2006 | Sato et al. | 257/315 |
| 2007/0066004 A1* | 3/2007 | Nakagawa et al. | 438/201 |
| 2008/0073688 A1* | 3/2008 | Tu et al. | 257/304 |

FOREIGN PATENT DOCUMENTS

| | | |
|---|---|---|
| EP | 0 975 022 A1 | 1/2000 |
| EP | 0 936 672 A3 | 8/2001 |
| JP | 09/205154 | 8/1997 |
| JP | 10/074914 | 3/1998 |
| WO | WO 00/38237 | 6/2000 |

* cited by examiner

PRIOR ART

FIG. 4(a)
PRIOR ART
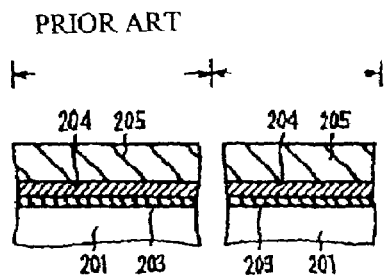
FIG. 4(b) PRIOR ART
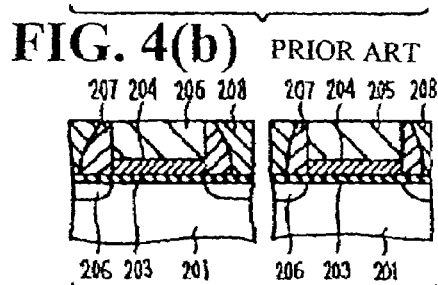
FIG. 4(c)
PRIOR ART
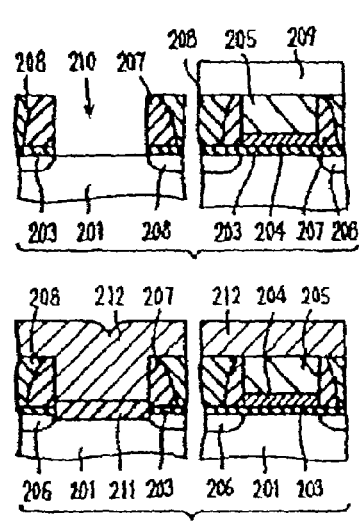
FIG. 4(d)
PRIOR ART
FIG. 4(e) PRIOR ART
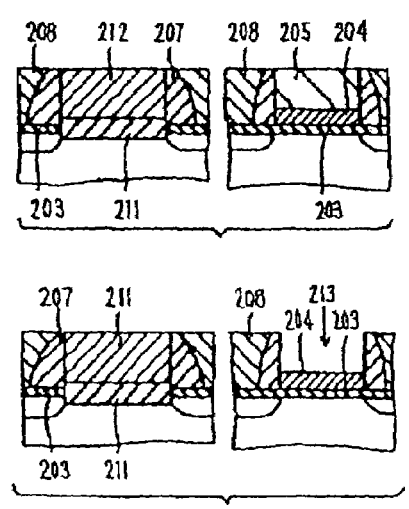
FIG. 4(f)
PRIOR ART
FIG. 4(g)
PRIOR ART
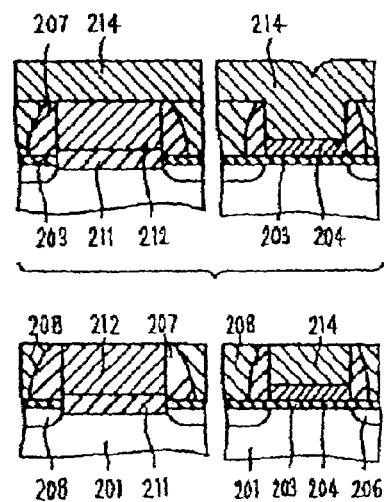
FIG. 4(h)
PRIOR ART +TiN etc.

(W etc.)

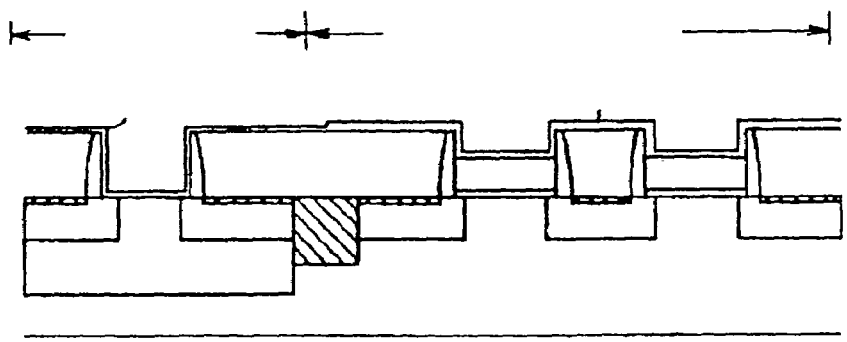
FIG. 19(a)
FIG. 19(b)
(W+TiN etc.)+
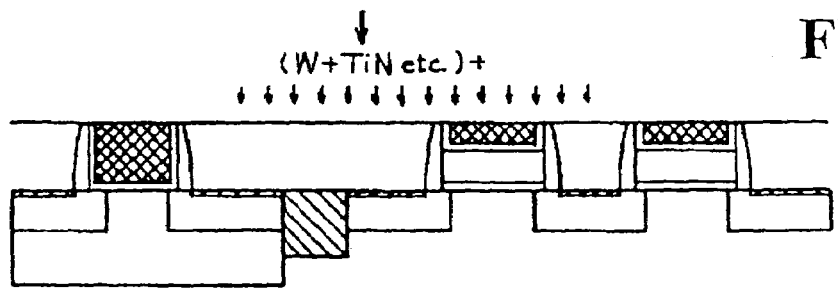
FIG. 19(c)
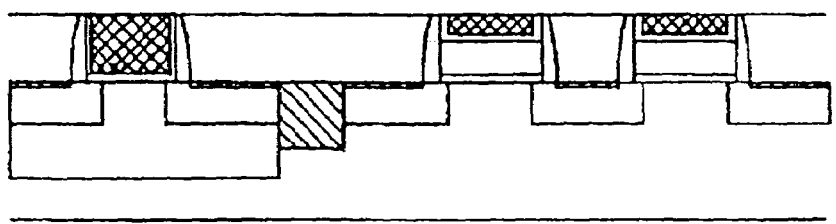
FIG. 19(d)

FIG. 23(a)
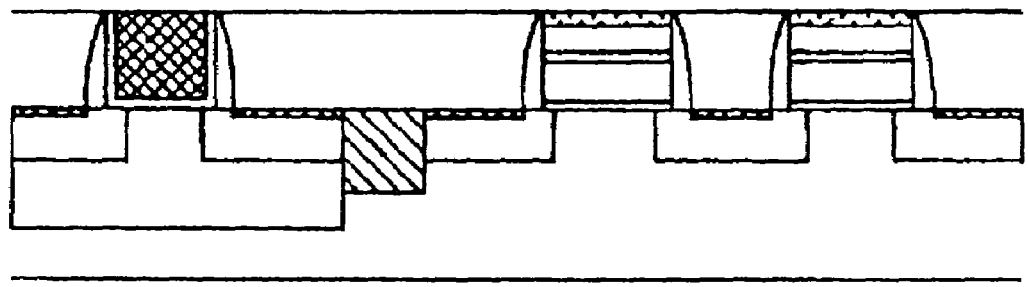
FIG. 23(b)
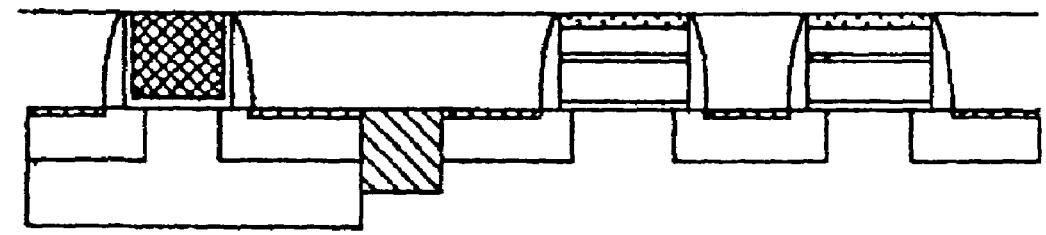

SEMICONDUCTOR DEVICE AND ITS MANUFACTURING METHOD

This application is a divisional of application Ser. No. 10/423,963, filed Apr. 28, 2003, which is a continuation of application Ser. No. 09/964,592, filed Sep. 28, 2001, which is now abandoned.

FIELD OF THE INVENTION

The present invention concerns a method for manufacturing a semiconductor device endowed with multiple functions. More specifically, it concerns a method for manufacturing a semiconductor device on which a non-volatile memory cell which consists of a double gate-type semiconductor element, etc. and a logic circuit unit which consists of a single gate-type semiconductor element have been heterogeneously mounted.

BACKGROUND OF THE INVENTION

Regarding semiconductor memory devices such as simple flash memories and EEPROMs (electrically re-writable non-volatile memory cells), one-chip products with added values which are endowed with the functions of peripheral circuits (e.g., logic device, etc.) have generated considerable demand in recent years in relation to the applications of the respective devices rather than to applications whereby their respective functions are customized for users' utilities. Single gate-type transistor elements, however, become the central circuit elements for the logic device, and since they are constituted in certain combinations which are capable of meeting the essential circuit logic requirements, the transistor elements within the circuit are not necessarily configured in an orderly fashion. In contrast, a memory device is provided by configuring memory cell transistors which serve as memory elements at intersections of word lines and bit lines, and therefore the memory cell transistors within the circuit are normally configured in an orderly fashion. In the cases of semiconductor memory devices such as simple flash memories and EEPROMs (electrically re-writable non-volatile memory cells), furthermore, double gate-type transistors are generally embodied as memory cells, whereas single gate-type transistors are generally employed as logic devices. In the context of providing common and abbreviated processes for forming transistor gates, therefore, it is necessary to develop unprecedented processes.

In addition to the foregoing factors, further attempts are beginning to be made to alter gate electrode formation processes innovatively by forming gate electrodes with an electroconductive metallic material for the purposes of lowering the intrinsic gate electrode resistance and accordingly upgrading the device speed. In order to adapt such a novel technology to a heterogeneously-mounted semiconductor device, a correspondingly novel scheme for abbreviating and streaming its manufacturing processes as much as possible becomes necessary.

Next, two examples of the prior art, namely a method for manufacturing a flash memory and a method for manufacturing a device which consists of single gate-type transistors based on the drama scene gate process, will be explained.

FIGS. 1 through 3 are diagrams provided for explaining the respective processes of a method of the prior art for manufacturing a flash memory. FIGS. 1(a)-1(c) show the processes in proper order along the α-α' cross section in the upper plane representation of the diagram shown at the top of FIG. 1(a). A peripheral transistor is shown on the left side of the diagram at the top, whereas a non-volatile memory cell region is shown on its right side, as shown in FIG. 1(a).

First, a thermal oxide film ($SiO_2$) and an insulating film (e.g., $Si_3N_4$, etc.) are grown at thicknesses of 12 nm and 200 nm, respectively, above a semiconductor substrate of a given electroconductivity type ($P^+$), and a sufficiently deep channel is formed in an isolating region by means of dry etching by using a hard mask obtained by patterning it. An oxide film whose thickness is large enough for completely filling this channel is deposited, and a portion of the oxide film protruding from the channel is removed by means of CMP (chemical mechanical polish) for the purpose of flattening the surface. Next, the thermal oxide film ($SiO_2$), which serves as a stopper film, and the insulating film ($Si_3N_4$) are removed, as a result of which a buried oxide film structure of the STI (shallow trench isolation) modality is obtained as shown in FIG. 1(b).

Next, referring to FIG. 1(c), an impurity ion is implanted into the peripheral transistor region and then thermally diffused, as a result of which a well of a desired shape is formed. Next, a thin oxide film which is to become the first gate insulating film (tunnel gate insulating film, TNOX) of the non-volatile memory is formed on the entire plane of said semiconductor substrate based on the thermal oxidation method.

Next, referring to FIG. 2(a), a first polycrystalline silicon film is formed on the entire plane based on the CVD (chemical vapor deposition) method. Next, a resist is preliminarily patterned based on the photolithographic method for the purpose of forming a resist mask in the context of the isolation of the floating gate of the non-volatile memory. Next, the first polycrystalline silicon film is dry-etched and patterned by using this resist mask. An oxide layer (or an ONO film [silicon oxide film/silicon nitride film/silicon oxide film]) is then formed on the first polycrystalline silicon film as a second gate insulating film (PA (first wire layer)-PB (second wire layer) gap interlayer insulating film). The resist film which blankets the entire plane is subsequently patterned based on the photolithographic method.

Next, referring to FIG. 2(b), the second gate insulating film (PA (first wire layer)-PB (second wire layer) gap interlayer insulating film) and first polycrystalline silicon film (floating gate) are dry-etched and patterned in proper order by using the obtained resist pattern as a mask, whereas the aforementioned second gate insulating film and first polycrystalline silicon film remain partially unetched in such a way that a gate pattern will be selectively formed in the non-volatile memory cell region alone and that the second gate insulating film and the first polycrystalline silicon film will be completely removed from the remainder.

Next, referring to FIG. 2(c), the first gate insulating film in the peripheral transistor region is removed by means of a preliminary treatment, and a thin third gate insulating film (GOX) is grown on the corresponding site.

Next, referring to FIG. 3(a), a thick second polycrystalline silicon film is formed on the entire plane, and an SION film which serves not only as an anti-reflection film but also as a dry etching stopper film during subsequent processes is deposited on a site immediately above it, and a photoresist is subsequently formed patternwise. A floating gate electrode and a control gate electrode within the non-volatile memory cell region are patterned based on the photolithographic method. Next, the prevailing mask is substituted with a new pattern mask, and the gate electrode within the peripheral transistor region is patterned based on the photolithographic method.

Next, referring to FIG. 3(b), a source-drain diffusion layer ($n^+$ diffusion layer) for the non-volatile memory cell region is formed in a self-matching fashion by implanting arsenic whose electroconductivity is the opposite of that of the substrate as an impurity ion.

Referring to FIG. 3(b), after a thick oxide film has subsequently been grown based on the chemical vapor deposition method, the entire plane is anisotropically etched in such a way that side wall insulating films will remain on the gate electrode side wall of the peripheral transistor region and the side walls of the floating gate electrode, second gate insulating film, and control gate electrode of the non-volatile memory cell region and that the oxide film will be removed from the remainder. Next, the isolating insulation film is partially removed by using a resist pattern on which a pattern of the source region of the non-volatile memory cell region has been formed negatively while the second polycrystalline silicon layer is being employed as a partial mask portion, as a result of which a common source region (so-called "self-aligned source (SAS) region") is formed in a self-matching fashion. Next, a peripheral transistor source-drain diffusion layer ($n^+$ diffusion layer) is formed by ionically implanting arsenic the electroconductivity of which is the opposite of that of the substrate in a self-matching fashion. Arsenic is concomitantly introduced to the site from which the isolating insulation film has been removed previously. A transistor source region and a common source wire layer are formed in a self-matching fashion. Next, the SiON film above the gate electrode is removed by means of a liquid chemical treatment. Next, a thin Co (cobalt)-TiN (titanium nitride) layer is grown over the entire plane, and subsequently, a high-melting-point metal silicide layer (CoSi (cobalt silicide) layer in this case) is formed by means of RTA (rapid thermal annealing), whereas unreacted [Co (cobalt)+TiN (titanium nitride)] is dry-etched and removed. The obtained product is further subjected to annealing based on the RTA. As a result, a high-melting-point metal silicide layer (so-called "salicide layer") is formed above the gate electrode and source-drain diffusion layer in a self-matching fashion.

Next, a sufficiently thick interlayer insulating is formed blanketwise on the entire plane. Although subsequent processes are not graphically shown, a non-volatile semiconductor memory device is obtained by drilling a contact hole on the interlayer insulating film and by then forming an electrode wire. The foregoing processes comprise the method of the prior art for manufacturing a flash memory.

Next, a method of the prior art for manufacturing a single-layer gate element based on the damascene gate process will be explained.

FIG. 4 is a schematic demonstrational diagram which shows the method of the prior art for manufacturing a single-layer gate element which possesses a damascene gate, where FIG. 4(a) through FIG. 4(h) show cross-sectional views of the respective processes in proper order. The diagram for each process shows cross-sectional views of a first transistor (left in the figure) and a second transistor (right in the figure), which possess distinct gate insulating films and gate electrodes during the corresponding process. The method shown in FIG. 4 is described in Japanese Patent Application Publication No. Kokai Hei 11-74369, and explanations will be provided below with reference to it.

First, a well region and an isolating region characterized by the STI structure are formed above the semiconductor substrate (201) (not shown in the figure). Subsequently, a thin layer is formed as the gate oxide layer (203) based on the thermal oxidation method, followed by the depositions of the polysilicon film (204) and the silicon nitride film (205) above it in proper order based on the CVD (chemical vapor deposition) method. Next, the laminate structure constituted by the polysilicon film (204) and the silicon nitride film (205) is patterned into a shape suitable for a gate electrode pattern based on the photolithographic method. Next, an electroconductive impurity is introduced to the interior of the semiconductor substrate (201) by using the patterned gate electrode as a mask based on the ion implantation method, and the obtained structure is designed to function as an LDD (lightly doped drain) layer on a later occasion. Subsequently, the side wall insulating film (207), which consists of a silicon oxide film, is formed on the side wall of the patterned gate electrode. An electroconductive impurity is ionically implanted by using as a mask a dummy gate structure constituted by the dummy gate electrode and side wall insulating film (207). The source-drain diffusion region (206) is subsequently formed by means of a thermal annealing. Next, the silicon oxide film (208) is formed on the entire plane based on the CVD method, as a result of which the entire dummy gate structure becomes blanketed. The silicon oxide film (208) is subsequently etched back based on the CMP (chemical mechanical polish) method by using the silicon nitride film (205) as an etching stopper, as a result of which its entire surface becomes planarized, as shown in FIG. 4(b).

Next, referring to FIG. 4(c), a region on which a first transistor is to be formed is covered with the photoresist (209), and the silicon nitride film (205) and the polysilicon film (204) are removed in proper order, as a result of which the channel unit (210) is formed.

Referring to FIG. 4(d), a channel ion implantation operation is effectively carried out through the gate oxide layer (203), which has been bared on the bottom plane of the channel unit (210), and the gate oxide layer (203) of this bared region is subsequently removed. Next, the gate oxide film (211) is formed on the surface of the semiconductor substrate (201) in the bared region based on the thermal oxidation method, and the tungsten film (212) is ether formed over the entire plane.

Next, referring to FIG. 4(e), the tungsten film (212) which has been formed outside the channel unit (210) is removed based on the CMP (chemical mechanical polish) method, as a result of which the tungsten film (212) remains within the channel alone.

Referring to FIG. 4(f), the silicon nitride film (205) above the polysilicon film (204) is peeled, as a result of which the polysilicon film (204) becomes bared, and the channel unit (213) is formed.

Next, referring to FIG. 4(g), the tungsten film (214) is deposited on the entire plane.

Next, referring to FIG. 4(h), the tungsten film (214) is polished based on the CMP (chemical mechanical polish) method, as a result of which the tungsten film (214) remains only within the first transistor channel.

Next, a thick interlayer insulating film is formed, and after a contact hole has been formed on it, an electrode wire is further formed, as a result of which a non-volatile memory is obtained.

First, problems specific to the logic unit transistor of the prior art and the flash unit transistor of the prior art will be individually explained, and subsequently, problems that must be solved when both the logic and flash units are heterogeneously mounted will be discussed.

It is indispensable to lower the resistance of the gate electrode and to improve the current drive capacity for the purpose of upgrading the speed of a transistor. The thickness of a silicate film may be increased in order to lower the gate resistance. In such a case, the gate height becomes excessive in relation to its length in the context of size reduction, which is problematic in that it becomes difficult to process a gate. It is necessary to ensure the formation of a sufficient channel even at a lower voltage which becomes unavoidable as a result of such a size reduction attempt for the purpose of improving the current drive capacity, and therefore, the thickness of the gate insulating film needs to be minimized. When the thickness of a silicon oxide film is reduced to 5 nm or less, however, the leak current increases, which is problematic in that the transistor performances deteriorate. Major problems specific to the logic unit transistor can be thus characterized.

Problems associated with a case where the resistance of a flash memory cell gate is lowered will be explained. In the case of an LSI on which a flash memory and a logic device have been heterogeneously mounted, it is indispensable to increase the speeds of not only the logic unit but also the flash memory cell. As in the case of the logic unit, it is necessary to increase the thickness of the silicide film for the purpose of lowering the gate resistance, but in such a case, the height of the gate becomes excessively great in relation to its length, as a result of which it becomes difficult to process a gate. In the case of a flash memory characterized by a laminate structure of a floating gate and a control gate, such a tendency is more conspicuous than in the case of the logic unit.

Next, problems associated with the coupling ratio and data retention capacity of the flash memory will be explained. When the potential of the floating gate is defined as $V_{FG}$, the potential of the control gate as $V_{CG}$, the capacitance between the semiconductor substrate and floating gate as $C_0$, and the capacitance between the floating gate and control gate as $C_1$, the following relationship can be ascertained between $V_{FG}$ and $V_{CG}$:

$$V_{FG}=1/(1+C_0/C_1) \times V_{CG}; V_{FG}/V_{CG}=1/(1+C_0/C_1); V_{FG}/V_{CG} \text{ will be referred to as the "coupling ratio."}$$

$C_0/C_1 \approx 0$ should ideally hold when $C_0 \ll C_1$ holds, and the potential which has been impressed on $V_{CG}$ should be undepletedly impressed on $V_{FG}$ under the co-pervasion of $C_0/C_1 \approx 1$.

When the coupling ratio is low, it becomes impossible to lower the voltage impressed on the control gate electrode during data encoding and erasure operations vis-à-vis the flash memory despite the reduced element size. The electricity consumption may be minimized in the logic unit, but since a high voltage becomes necessary for the flash memory cell, it becomes impossible to reduce the electricity consumption for the entire chip. The chip area, furthermore, becomes inevitably enlarged in that a circuit for converting a low power source voltage into a high voltage becomes necessary. This tendency becomes more conspicuous as the power source voltage diminishes as a result of the progressive size reduction of the logic unit.

The thickness of the insulating film may be reduced for purposes of elevating the aforementioned $C_1$ and accordingly of improving the coupling ratio. In such a case, however, the leak current inevitably increases, as a result of which the data retention capacity deteriorates.

It may also appear feasible to increase the contact area between the floating gate and control gate for the purpose of elevating the aforementioned $C_1$. In such a case, however, the enlargement of the cell area and the complication of the structure become problematic.

Finally, problems associated with an operation for manufacturing a heterogeneously flash memory-mounted logic LSI will be explained. Regarding transistors to be used for the logic unit, transistor test results based on a format wherein a film of W (tungsten), whose resistance is lower than that of the silicide film, is formed based on the CMP (chemical mechanical polish) method while a gate insulating film constituted by $Ta_2O_5$, whose permittivity is higher than that of the silicon oxide film, is being concomitantly used have been reported, as described in A. Yanagishita, et al., *IEDM Tech. Dig.*, 1998, pp. 785-788; A. Chatterjee, et al., *IEDM Tech. Dig.*, 1998, pp. 777-780.

These reports, however, are each limited to disclosures of test samples constituted by unintegrated transistors, and accordingly they fail to mention methods applicable to heterogeneously flash memory-mounted logic LSIs.

When the aforementioned high-permittivity film and metal gate are simply used for the logic unit alone, however, the number of processes and the cost increase in that a process separate from that for preparing a flash memory unit is required.

The height of the flash memory cell, furthermore, becomes greater than that of the logic unit transistor by a margin corresponding to the height of the floating gate electrode. Due to the concomitantly incurred step differential, processing safety margins for opening a contact hole and for forming a metal wire, which are to be formed on later occasions, diminish, as a result of which the reliability and yield deteriorate.

The foregoing analyses can be summarized as follows:

1): When the gate lengths of a flash memory cell and a logic region transistor are reduced in a heterogeneously flash memory-mounted logic LSI of the prior art, it is problematic in that it becomes impossible to reduce the resistance of the gate electrode under the pervasion of a silicide film alone.

When the thickness of the aforementioned silicide film is increased for the purpose of lowering the gate electrode resistance, furthermore, the ratio of the longitudinal dimension in relation to the lateral dimension (channel direction) increases to an excessive level, which is problematic in that it becomes difficult to process the gate electrode.

2): Either ON or ONO is employed as an insulating film between the floating gate and control gate of the non-volatile memory cell of the heterogeneously flash memory-mounted logic LSI of the prior art, and therefore, the coupling ratio can be elevated only by reducing the thickness of said insulating film or by enlarging the area of the aforementioned $C_1$ capacitor. The reliability, however, deteriorates at a reduced film thickness, whereas said area enlargement entails a memory cell area gain and/or a process complication. As a result, it is impossible to lower the voltage impressed on the control gate electrode, which is problematic in that it becomes impossible to minimize the electricity consumption.

3): Regarding the method for manufacturing the heterogeneously flash memory-mounted logic LSI of the prior art, when a high-permittivity film is employed as a gate insulating film while a metal (e.g., W, Al, etc.) is used as a gate electrode material for the purpose of upgrading the performances of the transistor within the logic region, it becomes impossible to share processes with the non-volatile memory cell, as a result of which the number of processes increases, and it is also problematic in that reliability loss and cost increase are incurred.

The height of the flash memory cell, furthermore, exceeds that of the logic unit transistor by a margin corresponding to the floating gate height. Due to the concomitantly incurred step differential, processing safety margins for opening a contact hole and for forming a metal wire, which are to be formed on later occasions, diminish, as a result of which the reliability and yield deteriorate.

SUMMARY OF THE INVENTION

The objective of the present invention is therefore to provide a heterogeneously flash memory-mounted logic LSI with a high degree of integration and a high reliability which is capable of solving the aforementioned problems based on simple and inexpensive mechanisms as well as is manufacturing method.

When an attempt is made to apply the aforementioned method for manufacturing a simple flash memory to the production of a heterogeneously mounted device, it becomes indispensable to reduce the thickness of a gate insulating film for the purpose of elevating the speed of a peripheral transistor outside the memory, but the effective thickness of the gate insulating film becomes inevitably large due to the depletion of the gate electrode, as a result of which it becomes impossible to raise the gate capacitance beyond a certain threshold. It may seem feasible to use a metallic material which is unaccompanied by depletion as said gate electrode from the standpoint of increasing the gate capacitance, but it has become urgent to establish a manufacturing method wherein a peripheral transistor which consists of an unintegrated gate transistor can be concomitantly formed during the formation of the flash memory cell and wherein a metal gate can be formed based on a simple process. When a gate electrode characterized by a polycide or polymetal structure is formed in concert with an attempt to reduce the thickness of the longitudinal gate structure rather than the metal gate, furthermore, it becomes necessary to reduce the thickness of the polysilicon layer. When such a gate electrode characterized by a polycide or polymetal structure is subjected to a high-temperature annealing operation upon the formation of the transistor gate, however, the metal layer above the polysilicon film becomes diffused through the thin polysilicon film, as a result of the likelihood of the deterioration of the oxide film increases. It is indispensable, therefore, for the gate formation process to follow the high-temperature annealing operation. When an attempt is made to apply the aforementioned method for manufacturing an unintegrated gate element which uses a damascene gate process to a device on which a flash memory and a logic transistor are heterogeneously mounted, furthermore, there is no known gate electrode structure constituted by two electrically separated layers of electroconductive films via an insulating film, although a laminate gate structure constituted by electroconductive films alone (polysilicon+tungsten) is known.

In the context of heterogeneously mounting a peripheral transistor which must meet a demanding action speed requirement and a non-volatile memory cell which includes a laminate gate as an indispensable element on a single chip, when an attempt is made to form the respective elements simultaneously in parallel by matching their processes and to form both of these heterogeneous elements together by means of the damascene process, it is necessary to secure a dummy gate whose height is equivalent to the height of the non-volatile memory cell in relation to the peripheral transistor in that the height of the longitudinal gate structure of the non-volatile memory cell exceeds that of the peripheral transistor. When a single-layer dummy gate is configured, however, the aspect ratio is high, and therefore, it becomes difficult to control the drilling of the substrate due to overetching, etc.

Mechanisms characterized by the constitutions shown below may, for example, be embodied in the present invention as mechanisms for solving the foregoing problems of the prior art.

(1) A semiconductor device which possesses a double gate-type non-volatile memory cell which consists not only of a first gate layer which has been obtained by laminating a floating gate electrode and a control gate electrode which consists of an electroconductor in proper order via an intermediate insulating film but also of a first gate side wall film which constitutes the side wall of said first gate layer and a peripheral transistor which consists not only of a second gate layer which consists of said electroconductor but also of a second gate side wall film which constitutes the side wall of said second gate layer and which additionally possesses an insulating film which has been formed in such a way that said double gate-type non-volatile memory cell and said peripheral transistor will be buried in it and whose surface has been planarized in a level fashion vis-à-vis said double gate-type non-volatile memory cell and peripheral transistor.

Regarding the aforementioned constitution of (1), furthermore, an isolating insulation film whose surface is virtually continuous and level with the surface of a semiconductor substrate may have also been formed within said semiconductor substrate between said double gate-type non-volatile memory cell and said peripheral transistor. It is possible, furthermore, for said intermediate insulating film and said first gate insulating film which is configured beneath said first gate layer to be constituted by an identical material at an identical thickness with regard to the aforementioned constitution. It is possible, furthermore, for said intermediate insulating film and said first gate insulating film which is configured beneath said first gate layer to be constituted by different materials at different thicknesses with regard to the aforementioned constitution. It is possible, furthermore, for said electroconductor to be a metal with regard to the aforementioned constitution. It is possible, furthermore, for said floating gate electrode to be constituted by polycrystalline silicon and for said control gate electrode and said second gate layer to be constituted by metals with regard to the aforementioned constitution. It is possible, furthermore, to provide a corresponding constitution which possesses a memory cell region which includes said double gate-type non-volatile memory cell and a peripheral transistor region which includes said peripheral transistor while they are isolated and defined by said isolating insulation film and wherein the thickness of said control gate electrode in said memory cell region exceeds the thickness of said control gate electrode above said isolating insulation film.

(2) A method for manufacturing a semiconductor device which includes the following processes in proper order: (a) a process whereby a dummy gate pattern which consists of multiple layers and which possesses a first electroconductive layer as the lowermost layer is formed on a memory cell region and a peripheral transistor region which have been defined above a semiconductor substrate; (b) a process whereby a coating film which covers said dummy gate pattern is formed; (c) a process whereby said coating film is dry-etched in such a way that a gate side wall film will selectively remain on the side plane of said dummy gate pattern; (d) a process whereby an interlayer insulating film is formed blanketwise on the remainder of the structure formed through the preceding processes; (e) a process whereby the surface of said interlayer insulating film is etched back based on the CMP (chemical mechanical polish) method until the surface of said intermediate insulating film and the surface of said dummy gate pattern become virtually continuous and flat; (f) a process whereby said dummy gate pattern is partially removed in such a way that said dummy gate pattern will be removed from said peripheral transistor region but will remain in said memory cell region and that said gate side wall film will remain in both said memory cell region and said peripheral transistor region; (g) a process whereby a second electroconductive layer is formed blanketwise on the remainder of the structure which has been formed through the preceding processes and which includes the region from which said dummy gate pattern has been removed; and (h) a process whereby the surface of said interlayer insulating film is etched back based on the CMP (chemical mechanical polish) method until the surface of said interlayer insulating film and the surface of said second electroconductive layer become virtually continuous and flat.

It is possible, furthermore, for a coating film which possesses an upper silicon layer and a lower silicon layer which sandwich an insulating film to be formed as said dummy gate pattern in said process of (a) and for said process of (e) to be implemented in such a way that said insulating film will remain and that said upper silicon layer will be removed with regard to the aforementioned mechanism of (2). It is possible, furthermore, for a process whereby an intermediate insulating film is formed above said first electroconductive layer to be additionally included between said processes of (e) and (f).

Incidentally, when a dry etching operation is carried out in process (c) of the aforementioned mechanism of (2) while the non-peripheral portion of the memory cell region is selectively blanketed by a resist, not only the side wall film but also a coating film which blankets the source-drain region can be induced to remain in the memory cell region. Effects of avoiding the diffusion of the silicidation of the peripheral transistor into the memory cell region (i.e., selective silicidation) and of preventing damage due to source-drain ion implantation can be expected under the persistent pervasion of this coating film.

The foregoing explanations discuss mechanisms of the present invention for solving the problems. In the following, detailed problem solution mechanisms will be discussed in detail with reference to application embodiments.

An ordinary non-volatile memory cell (double gate-type) is formed in a non-volatile memory cell region and a peripheral transistor region by using a double-layer dummy gate pattern (which partially constitutes the non-volatile memory cell) together with said non-volatile memory cell region and peripheral transistor region. In such a case, the respective gate heights of the nonvolatile memory cell region and the peripheral transistor region coincide, and the tops of the dummy gates of the non-volatile memory cell region and the peripheral transistor region can be bared within a single CMP (chemical mechanical polish) process by polishing the interlayer insulating film. The second electroconductive film [PB (second wire layer) (upper dummy gate layer)] and the second gate insulating film [dummy insulating film in the PA (first wire layer)-PB (second wire layer) gap] of each of the non-volatile memory cell region and the peripheral transistor region are then removed, and subsequently, the first electroconductive film [PR (first wire layer) (lower dummy gate layer)] and the first gate insulating film [TNOX] are removed by using the non-volatile memory cell region as a mask. In such a case, the first electroconductive film [PA (first wire layer) (used as an element)] and the first gate insulating film [TNOX] of the non-volatile memory cell region are induced to remain in such a way that they can be used as partial elements. Next, high-permittivity films which respectively serve as a gate insulating film within the peripheral transistor region and a second gate insulating film [insulating film in the PA (first wire layer)-PB (second wire layer) gap] within the non-volatile memory cell region are simultaneously formed (including a case where the respective constitutions and thicknesses of the gate insulating film of the peripheral transistor region and the second gate insulating film of the non-volatile memory cell region are induced to differ based on lithographic and/or etching processes). A metal is then deposited on the entire plane (including a case where a laminate is obtained by forming a third electroconductive film (polysilicon) above the high-permittivity film and by then depositing a metal gate over the entire plane), and after the resulting surface has been polished by means of a CMP (chemical mechanical polish) process, low-resistance metal gates are formed respectively in the non-volatile memory cell region and the peripheral transistor region.

An ordinary non-volatile memory cell (double gate-type) structure is formed in each of a non-volatile memory cell region and a peripheral transistor region by using a double-layer electroconductive film (the first electroconductive film of the non-volatile memory cell region has been partially separated for isolating purposes) for the non-volatile memory cell region and peripheral transistor region. In such a case, the respective gate heights of the non-volatile memory cell region and peripheral transistor region coincide, and the tops of the dummy gates of the non-volatile memory cell region and the peripheral transistor region can be bared within a single CMP (chemical mechanical polish) process by polishing the interlayer insulating film. This mechanism of (2), however, is unique in that the second electroconductive film [PB (second wire layer) (upper dummy gate layer)]/second gate insulating film [insulating film in the PA (first wire layer)-Pb (second wire layer) gap]/first electroconductive film [PA (first wire layer) (lower dummy gate layer)]/first gate insulating film [TNOX] portion of the peripheral transistor alone is removed while the double-layer electroconductive film of the non-volatile memory cell region remain intact, and after a high-permittivity film has subsequently been formed on the entire plane (including the channel on the peripheral transistor region side), a metal is deposited on the entire plane and then polished by means of a CMP (chemical mechanical polish) process, as a result of which a polycide gate is formed on the control gate electrode site of the non-volatile memory cell, whereas a low-resistance metal gate is formed in the peripheral transistor region.

An ordinary non-volatile memory cell (double gate-type) structure is formed in each of a non-volatile memory cell region and a peripheral transistor region by using a double-layer dummy gate (which partially constitutes a memory cell element) for said non-volatile memory cell region and peripheral transistor region. In such a case, the respective gate heights of the non-volatile memory cell region and peripheral transistor region coincide, and the tops of the dummy gates of the non-volatile memory cell region and the peripheral transistor region can be bared within a single CMP (chemical/mechanical polish) process by polishing the interlayer insulating film. The second electroconductive film [PB (second wire layer) (upper dummy gate layer)] and the second gate insulating film [dummy insulating film in the PA (first wire layer)-PB (second wire layer) gap] are removed from each of the non-volatile memory cell region and peripheral transistor region, and subsequently, the first electroconductive film [PA (first wire layer) (lower dummy gate layer)] and the first gate insulating film [TNOX] of the peripheral transistor region are removed by using the non-volatile memory cell region as a mask. In such a case, the first electroconductive film [PA (first wire layer) (used as an element)] and first gate insulating film [TNOX] of the non-volatile memory cell region are induced to remain in such a way that they will be used as partial elements. Next, high-permittivity films which respectively serve as the gate insulating film of the peripheral transistor region and the second gate insulating film [insulating film in the PA (first wire layer)-PB (second wire layer) gap] of the non-volatile memory cell region are simultaneously formed. After a third electroconductive film [polysilicon] has subsequently been formed above said high-permittivity film, the third electroconductive film of the peripheral transistor region alone is etched and removed based on a photolithographic technique while the non-volatile memory cell region alone is being masked, and after a metal has been deposited on the entire plane, its surface is polished by means of a CMP (chemical mechanical polish) process, as a result of which different ones are formed as the control gate electrode structure of the non-volatile memory cell region and the gate electrode structure of the peripheral transistor region.

When a double-layer dummy gate structure is embodied for the peripheral transistor region and non-volatile memory cell region, their respective gate heights can be matched, and a CMP process for polishing the surface of an interlayer insulating film and a CMP process for polishing the surface of the metal, which are essential for the damascene gate modality, can be easily implemented.

Since the dummy gate is constituted by a double-electroconductive film structure in which an insulating film is sandwiched, a favorable etching controllability can be achieved when a deep damascene channel is dug (the insulating film which is sandwiched by the electroconductive films serves as a stopper film during the etching of the upper electroconductive film, based on which the laminate film can be etched stepwise while different etching attributes are being designated, based on which irregularities can be minimized and control can be facilitated).

Low-resistance gate electrodes can be formed in both the non-volatile memory cell region and peripheral transistor region based on the use of the damascene metal gate process. The problem of gate depletion can be avoided in that the gate structure is represented by a metal gate structure.

Even when its thickness is quite great, it is possible for the gate insulating film of the peripheral transistor region to achieve a high gate capacitance by virtue of the uses of high-permittivity (high-k) films as both the gate insulating film of the peripheral transistor region and the PA (first wire layer)-PB (second wire layer) gap insulating film of the non-volatile memory cell region (countermeasure against the thickness reduction limit of the $SiO_2$ film). The coupling ratio of the non-volatile memory cell region can, furthermore, be expected to improve (the data encoding and erasure performances of the non-volatile memory cell can be improved by improving the coupling ratio).

When the respective constitutions and thicknesses of the gate insulating film of the peripheral transistor region and the PA (first wire layer)-PB (second wire layer) gap insulating film of the non-volatile memory cell region are designated differently, film constitutions with different objective film properties can be provided for the respective elements (peripheral transistor region: Countermeasure against the thickness reduction limit of the $SiO_2$ film/non-volatile memory cell region: Essentiality of improving the coupling ratio while the requisite insulation voltage resistance of the PA (first wire layer)-PB (second wire layer) gap is being secured). Various gate electrode film thicknesses that match the performances of the respective elements can be selected by varying the respective constitutions and thicknesses of the gate electrode film of the peripheral transistor region and the control gate electrode film of the non-volatile memory cell region.

BRIEF DESCRIPTION OF THE DRAWINGS

FIGS. 4(a)-4(f) are schematic demonstrational diagrams pertaining to a method for manufacturing a semiconductor device of the prior art which possesses a damascene gate.

FIGS. 19(a)-19(d) are schematic demonstrational diagrams pertaining to the method for manufacturing a semiconductor device which complies with the second application embodiment of the present invention.

FIGS. 23(a)-23(b) are schematic demonstrational diagrams pertaining to the method for manufacturing a semiconductor device which complies with the third application embodiment of the present invention.

DETAILED DESCRIPTION OF THE PREFERRED EMBODIMENTS

FIGS. 5 through 8 show cross-sectional views [A-A' direction] of element regions configured in the first application embodiment of the present invention based on the damascene gate technique, and they show cross-sectional views of the element regions during the respective processes in proper order. FIGS. 9 through 13 show cross-sectional views [B-B' direction] of a segment of the non-volatile memory cell region of the first application embodiment of the present invention based on the damascene gate technique from which an isolating insulation film has been removed (common source region), and they show cross-sectional views of the segment of the non-volatile memory cell region from which an isolating insulation film has been removed (common source region) during the respective processes in proper order. FIGS. 14 through 17 show cross-sectional views [C-C' direction] of the word line direction of the non-volatile memory cell region of the first application embodiment of the present invention based on the damascene gate technique, and they show cross-sectional views of the word line direction of the non-volatile memory cell region during the respective processes in proper order. As shown in FIGS. 5(a), 9(a) and 14(a).

Figure 5A:
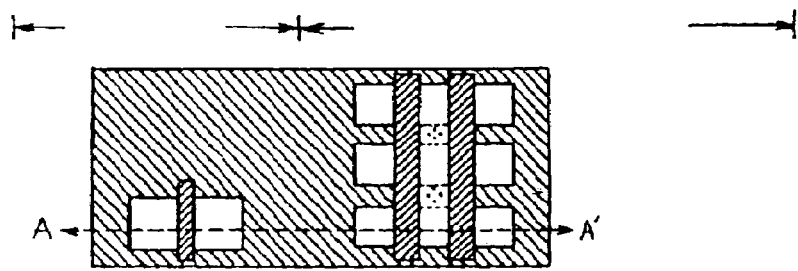
FIGS. 5(a)-5(c) are schematic demonstrational diagrams pertaining to a method for manufacturing a semiconductor device which complies with the first application embodiment of the present invention.
Figure 5B:
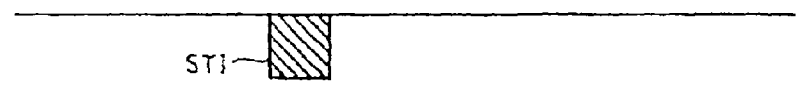
Figure 9A:
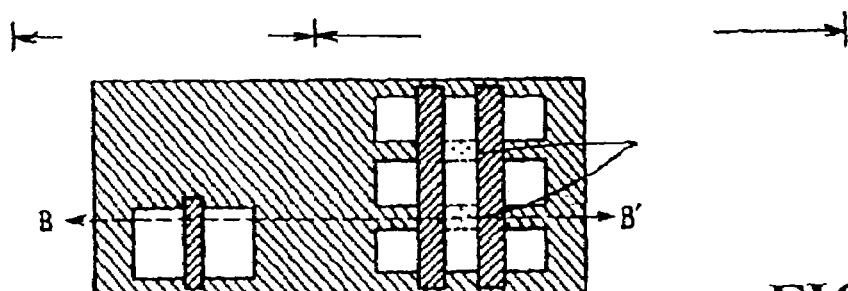
FIGS. 9(a)-9(d) are schematic demonstrational diagrams pertaining to the method for manufacturing a semiconductor device which complies with the first application embodiment of the present invention.
Figure 9B:
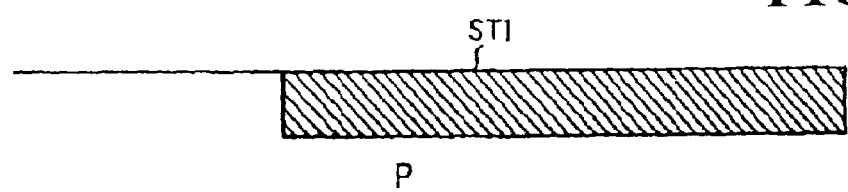
Figure 14A:
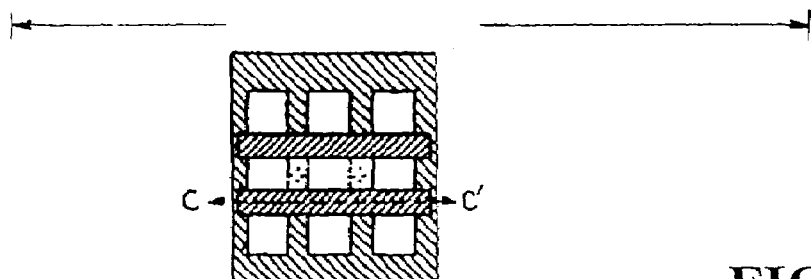
FIGS. 14(a)-14(d) are schematic demonstrational diagrams pertaining to the method for manufacturing a semiconductor device which complies with the first application embodiment of the present invention.
Figure 14B:
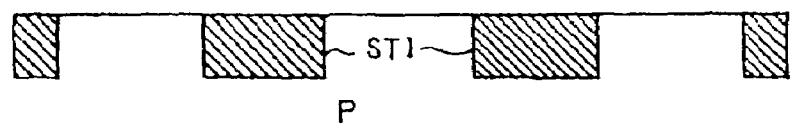

First, referring to FIGS. 5(b), 9(b) and 14(b), a thermal oxide film ($SiO_2$) and an insulating film (e.g., $Si_3N_4$, etc.) are grown above a semiconductor substrate of a given electro-conductivity type ($P^+$) at thicknesses of 12 nm and 200 nm, respectively, and a 300 nm channel is formed in an isolating region by means of etching by using it as a hard mask. An oxide film (e.g., HDP, etc.) is deposited on this channel at a thickness of 700 nm and then flattened by means of CMP (chemical mechanical polish) (STI: Shallow trench insulation). Next, the thermal oxide film ($SiO_2$), which serves as a stopper film, and the insulating film ($Si_3N_4$) are removed.

Figure 5C:
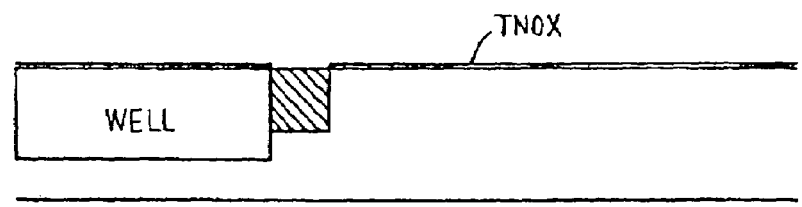
Figure 9C:
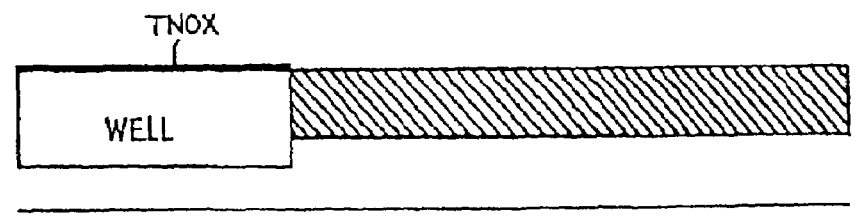
Figure 9D:
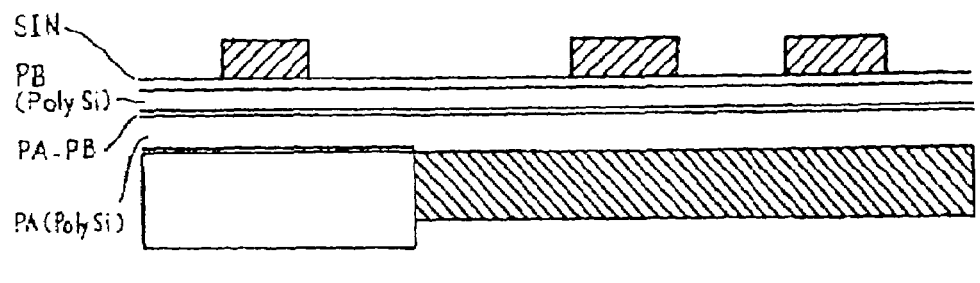
Figure 14C:
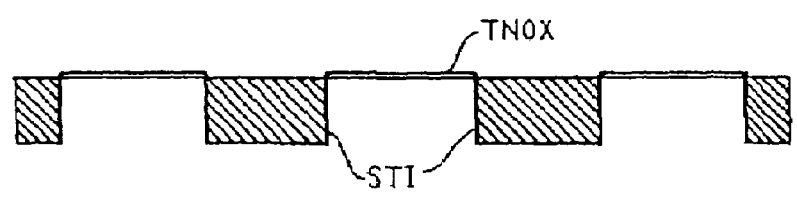
Figure 14D:
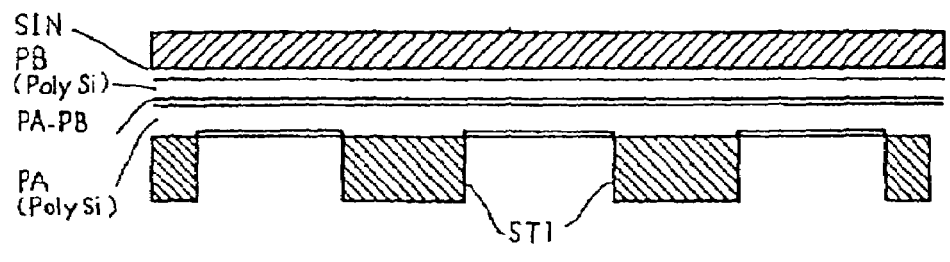

Next, referring to FIGS. 5(c), 9(c) and 14(c), an oxide film with a thickness of 10 nm is formed as the first gate insulating film (tunnel gate insulating film, TNOX) of the non-volatile memory cell based on the thermal oxidation method.

Figure 10A:
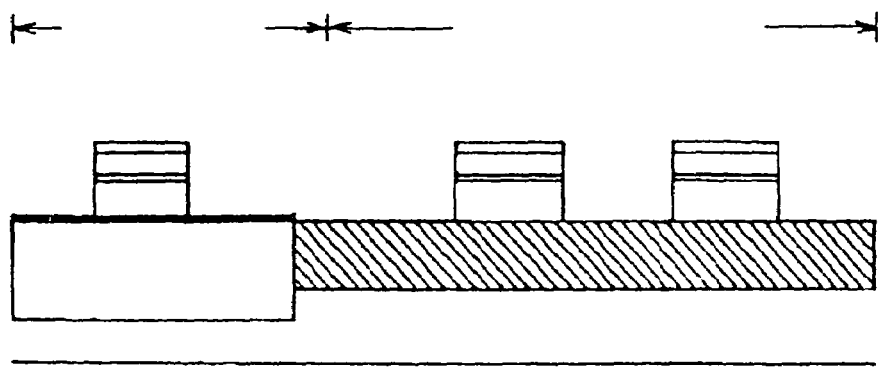
FIGS. 10(a)-10(c) are schematic demonstrational diagrams pertaining to the method for manufacturing a semiconductor device which complies with the first application embodiment of the present invention.

Next, referring to FIGS. 6(a) and 10(a), first polycrystalline silicon film is formed over the entire plane at a thickness of 90 nm, for example, and subsequently, a 20 nm oxide film is formed above said first polycrystalline silicon film as a dummy insulating film (insulating film between wire layers). It is also possible to use a doped amorphous silicon film in place of said first polycrystalline silicon film. Next, a 100 nm second polycrystalline film (dummy control gate) is formed, followed by the deposition of a 150 nm silicon nitride film (SiN film), which serves not only as an anti-reflection film but also as a stopper during an SAS (self-aligned source) etching operation, immediately above it based on a photolithographic technique. It is also possible to use a doped amorphous silicon film in place of said second polycrystalline silicon film.

Figure 10B:
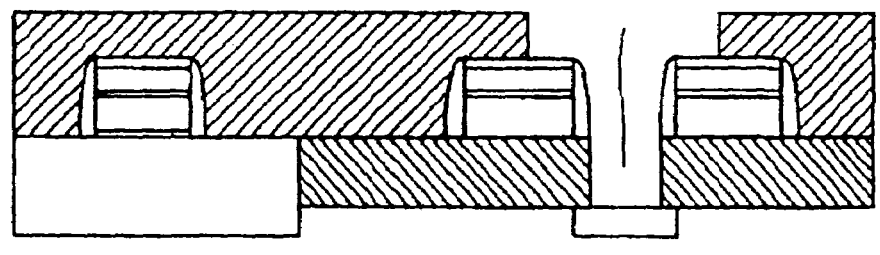

Referring to FIG. 10(b), a floating gate electrode and a dummy control gate electrode are formed patternwise in each of the peripheral transistor region and non-volatile memory cell region.

Next, a source-drain diffusion layer ($n^+$ diffusion layer) for the non-volatile memory cell region is formed in a self-matching fashion based on an impurity introduction technique which uses arsenic, whose electroconductivity is the opposite of that of the substrate, at an acceleration voltage or 50 keV and at a dosage of $3.0 \times 10^{16}$ dose/cm$^2$.

Figure 6A:
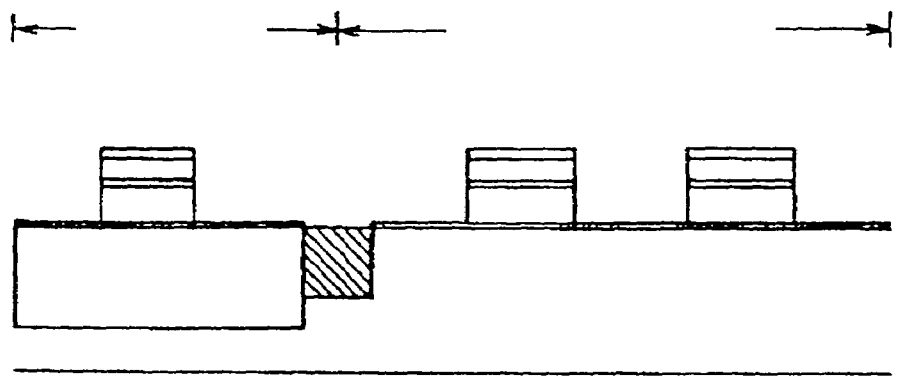
FIGS. 6(a)-6(c) are schematic demonstrational diagrams pertaining to the method for manufacturing a semiconductor device which complies with the first application embodiment of the present invention.
Figure 6B:
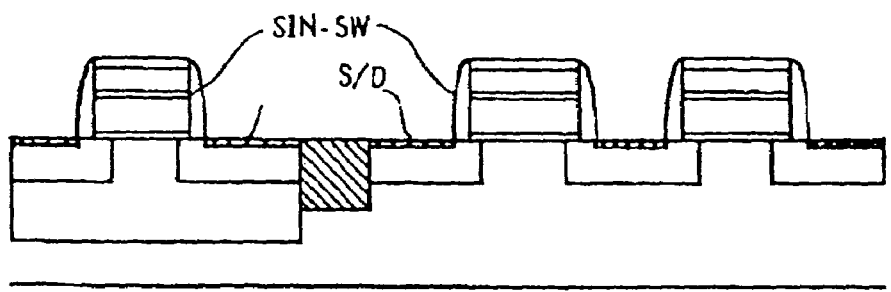
Figure 10C:
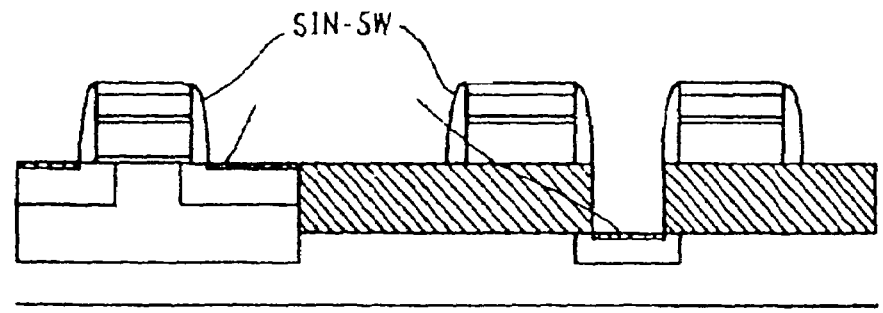

Next, referring to FIGS. 6(b) and 10(c), a 100 nm SiN film is grown based on the chemical vapor deposition method, followed by the anisotropic etching of the entire plane, as a result of which side wall insulating films are formed on the gate electrode side wall of the peripheral transistor region and the side walls of the floating gate electrode, dummy gate insulating film, and dummy control gate electrode of the non-volatile memory cell region. Next, the isolating insulation film is partially removed by means of dry etching (300 nm+10% over) by using the gate of the non-volatile memory cell region as a partial mask (SAS: Self-aligned source). Next, a source-drain diffusion layer (n$^+$ diffusion layer) for the peripheral transistor region is formed in a self-matching fashion based on an impurity introduction technique which uses arsenic, whose electroconductivity is the opposite of that of the substrate, at an acceleration voltage of 60 keV and at a dosage of $3.0 \times 10^{15}$ dose/cm$^2$. The impurity is concomitantly introduced to the segment from which the isolating insulation film has previously been removed, as a result of which a source region for the transistor and a common source wire region are formed in self-matching fashions.

Figure 11A:
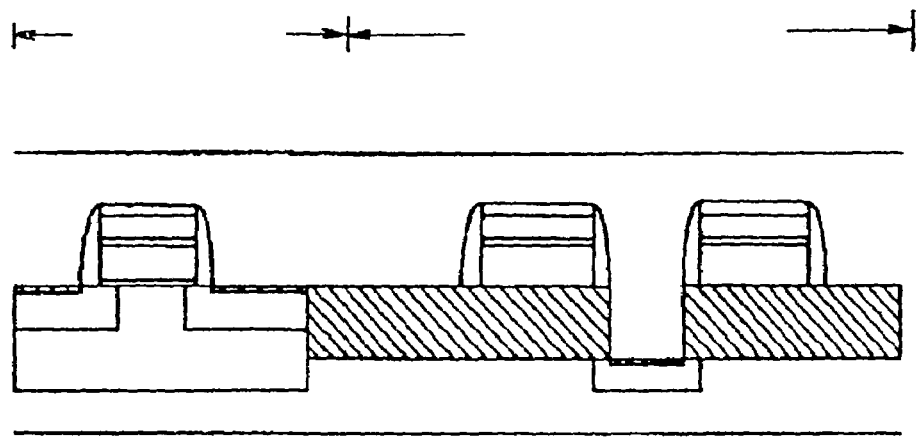
FIGS. 11(a)-11(c) are schematic demonstrational diagrams pertaining to method for manufacturing a semiconductor device which complies with the first application embodiment of the present invention.
Figure 15A:
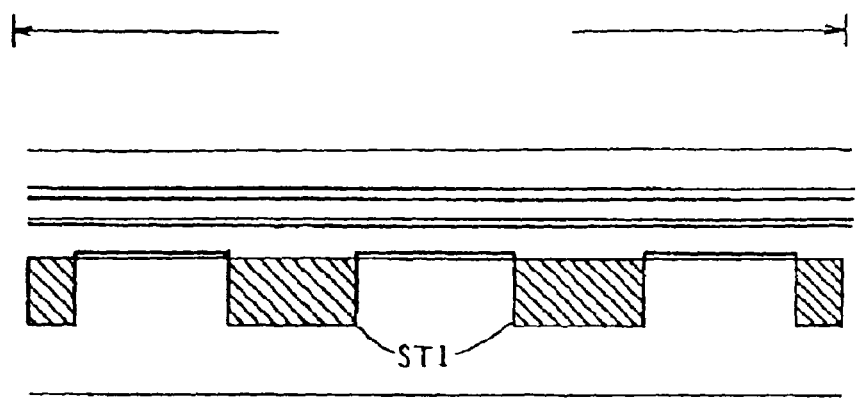
FIGS. 15(a)-15(c) are schematic demonstrational diagrams pertaining to the method for manufacturing a semiconductor device which complies with the first application embodiment of the present invention.

Next, referring to FIGS. 6(c), 11(a) and 15(a), [Co (9 nm)+TiN (30 nm)] is grown over the entire plane, and after a metal reactive layer (CoSi layer in this case) has subsequently been formed by means of RTA (500° C., N$_2$, 30 sec.), unreacted (Co+TiN) is etched over the entire plane, and subsequently, an RTA (800° C., N$_2$, 30 sec.) annealing operation is carried out [formation of a metal reactive layer on a source-drain diffusion layer (silicide process)].

Figure 7A:
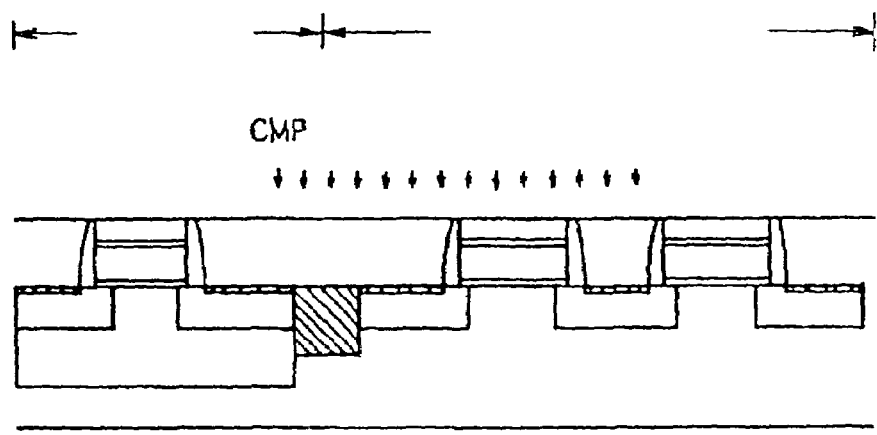
FIGS. 7(a)-7(c) are schematic demonstrational diagrams pertaining to the method for manufacturing a semiconductor device which complies with the first application embodiment of the present invention.
Figure 11B:
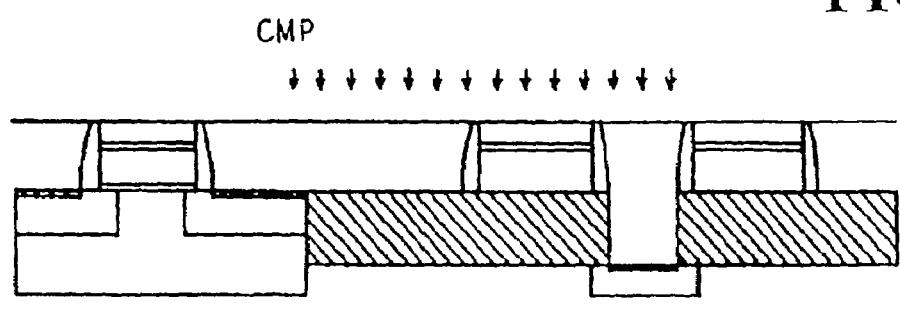
Figure 11C:
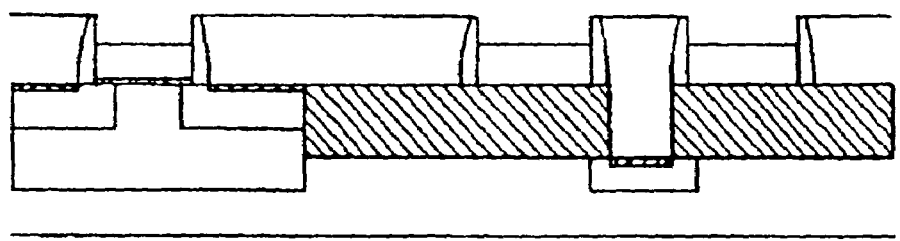
Figure 15B:
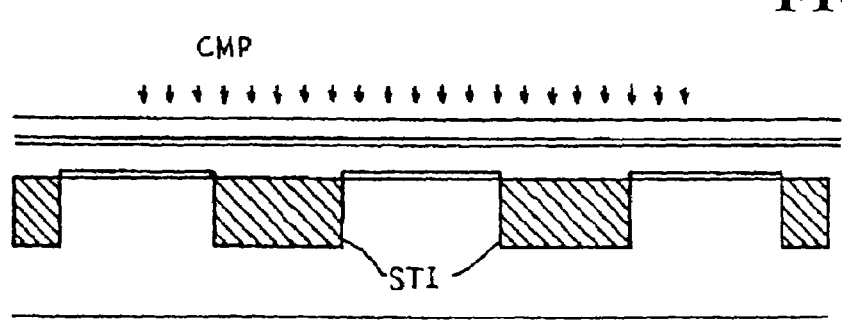
Figure 15:
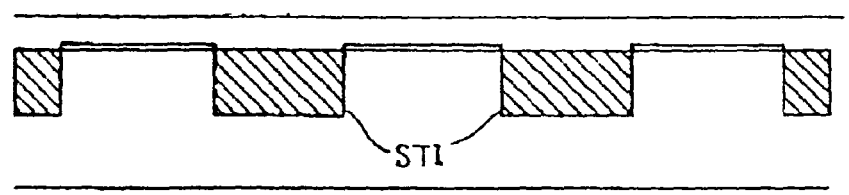

Next, referring to FIGS. 7(a), 11(b) and 15(b), an interlayer insulating film (SiO, 1,000 nm) is formed.

Subsequently, referring to FIGS. 7(b), 11(c) and 15(c), 800 nm is etched back by means of a CMP (chemical mechanical polish) process until the dummy control gate (second polycrystalline silicon film) becomes bared [SiN above the second polycrystalline silicon film and SiN on its side wall are partially polished and removed during this CMP (chemical mechanical polish) process].

Figure 16A:
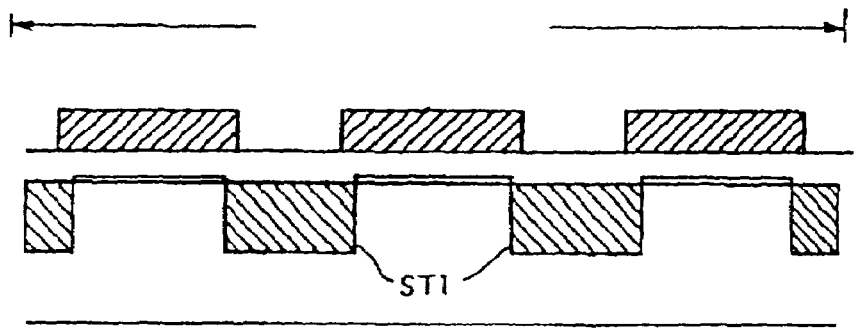
FIGS. 16(a)-16(d) are schematic demonstrational diagrams pertaining to the method for manufacturing a semiconductor device which complies with the first application embodiment of the present invention.

Next, referring to FIG. 16(a), the dummy control gate (second polycrystalline silicon film) of each of the peripheral transistor region and non-volatile memory cell region as well as the dummy insulating film underneath it are etched and removed over a depth of 20 nm.

Figure 7B:
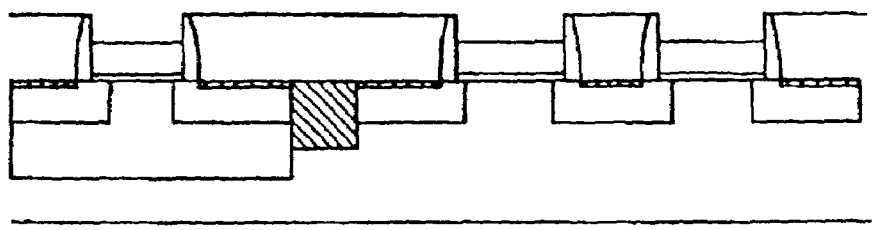
Figure 7C:
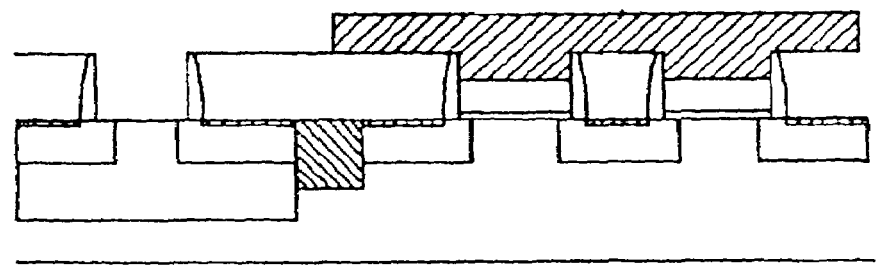
Figure 12A:
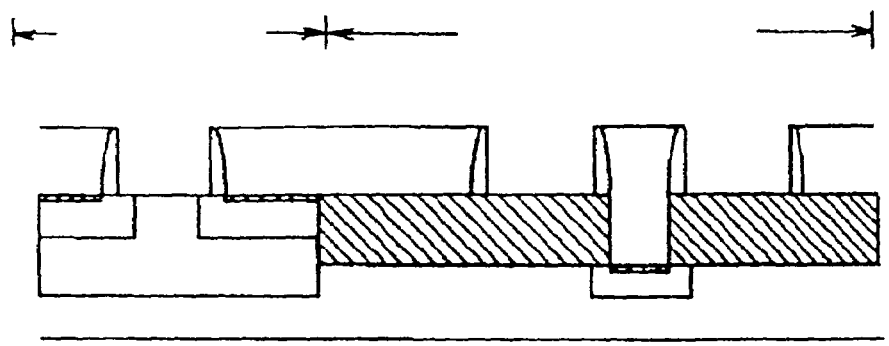
FIGS. 12(a)-12(c) are schematic demonstrational diagrams pertaining to the method for manufacturing a semiconductor device which complies with the first application embodiment of the present invention.
Figure 13A:
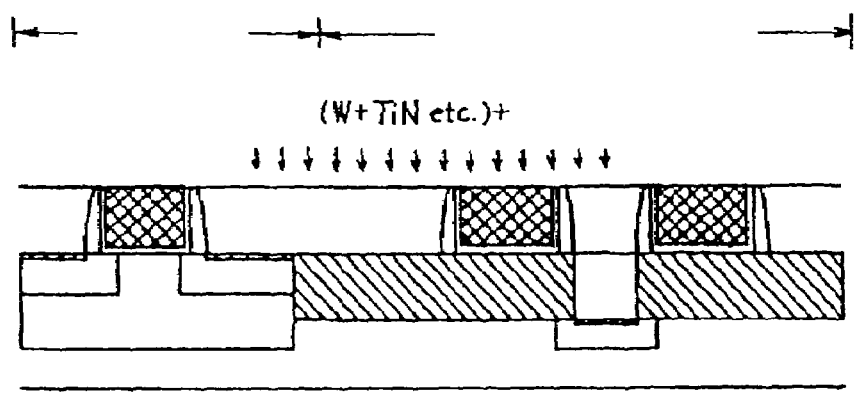
FIGS. 13(a)-13(b) are schematic demonstrational diagrams pertaining to the method for manufacturing a semiconductor device which complies with the first application embodiment of the present invention.
Figure 16B:
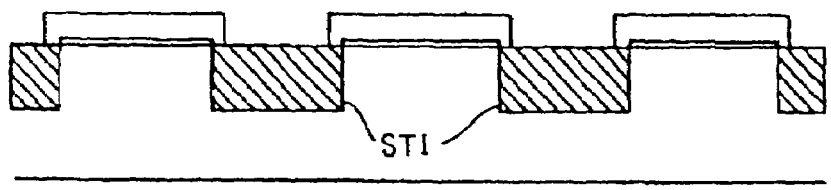

Next, referring to FIGS. 7(c), 12(a) and 16(b), the non-volatile memory cell region (area other than the first polycrystalline silicon film-first polycrystalline silicon film gap secured for isolation purposes) is masked by using a photolithographic technique.

Figure 8A:
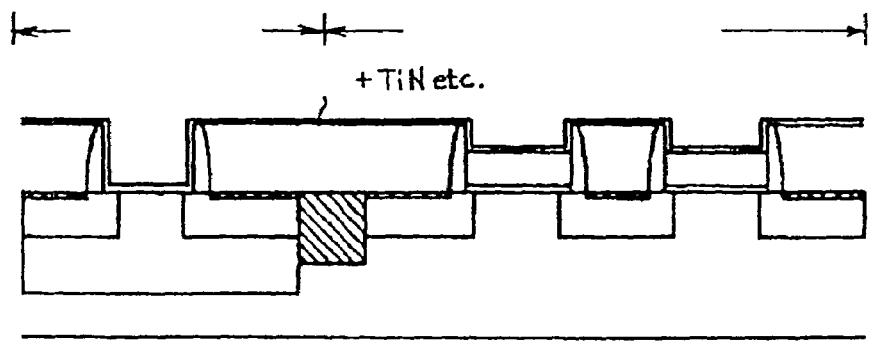
FIGS. 8(a)-8(d) are schematic demonstrational diagrams pertaining to the method for manufacturing a semiconductor device which complies with the first application embodiment of the present invention.
Figure 12B:
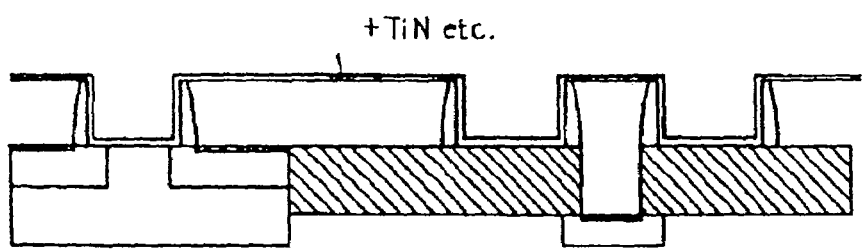
Figure 16C:
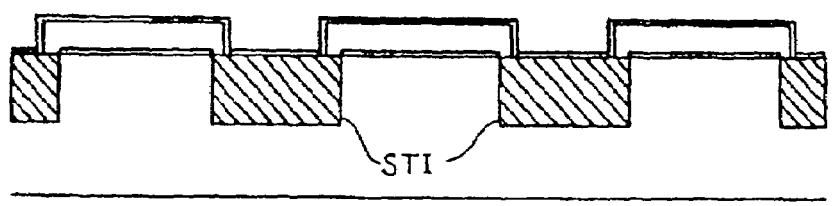

Referring to FIGS. 8(a), 12(b) and 16(c), the first polycrystalline silicon layer and first gate insulating film of each of the peripheral transistor region and non-volatile memory cell region are partially removed by means of an etching process (process whereby the floating gate region of the non-volatile memory cell region is induced to remain intact).

Figure 8B:
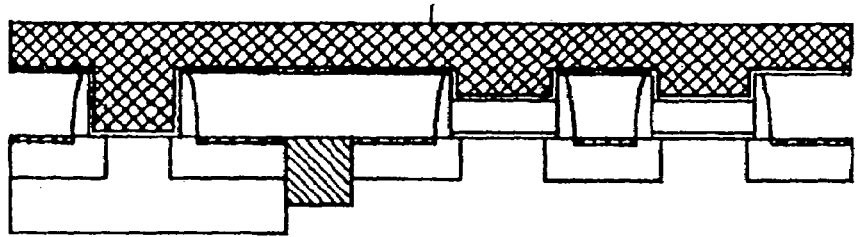
Figure 12C:
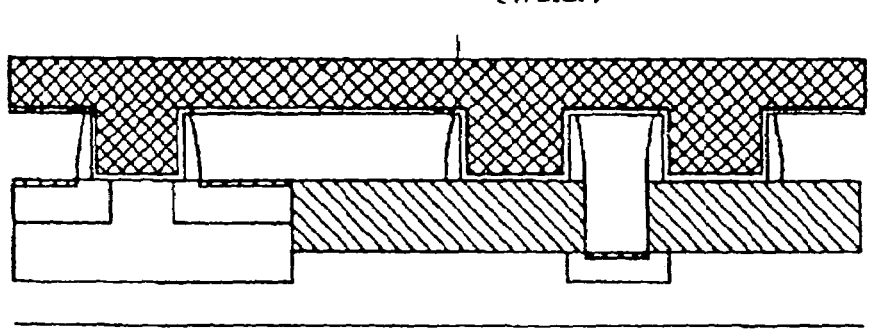
Figure 16D:
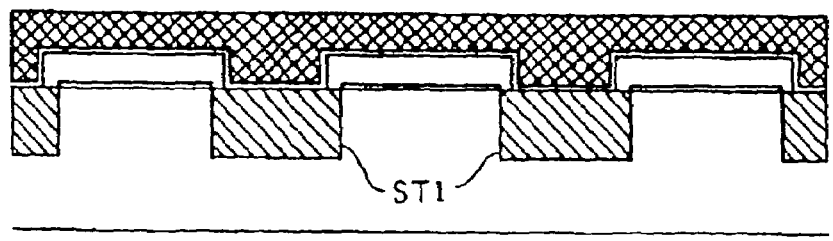

Next, referring to FIGS. 8(b), 12(c) and 16(d), a 1.5 nm thin SiO$_2$ film is formed on the channel in the aforementioned etched segment, followed by the formation of an SiON layer whose thickness is approximately 2 nm, and subsequently, a 6 nm high-permittivity film (e.g., Ta$_2$O$_5$) is formed above it as a gate insulating film. A metal layer which may, for example, be constituted by TiN (50 nm) is formed above it.

Figure 8C:
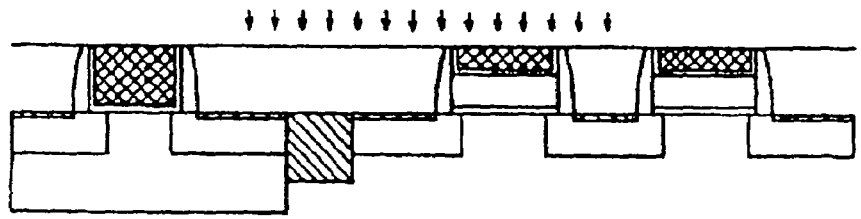
Figure 17A:
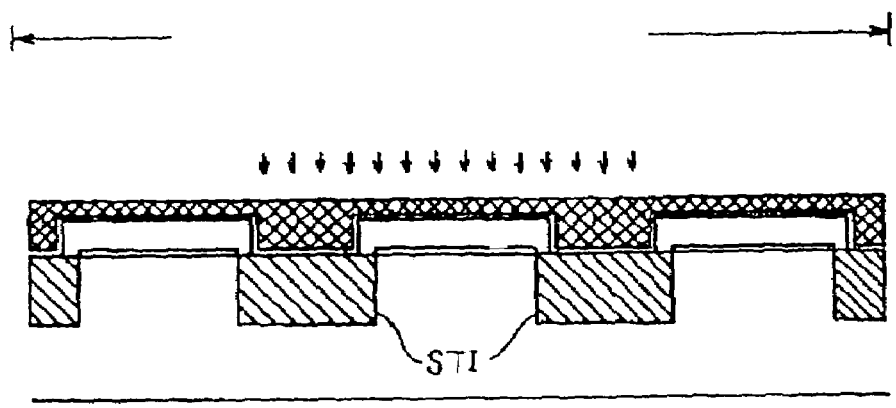
FIGS. 17(a)-17(b) are schematic demonstrational diagrams pertaining to the method for manufacturing a semiconductor device which complies with the first application embodiment of the present invention.

A layer which may, for example, be constituted by W (tungsten) is subsequently formed. As shown in FIGS. 8(c), 13(a) and 17(a).

Figure 8D:
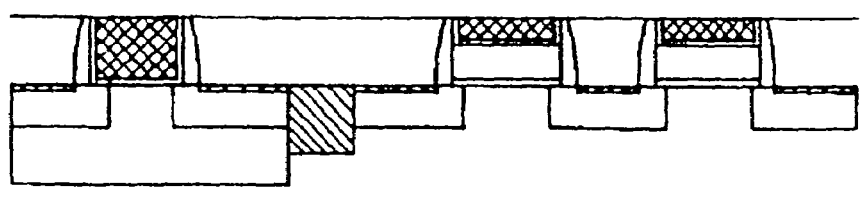
Figure 13B:
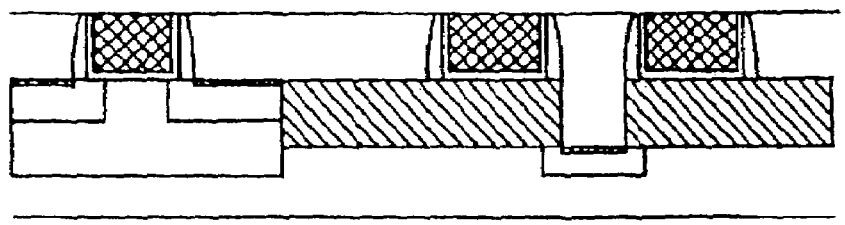
Figure 17B:
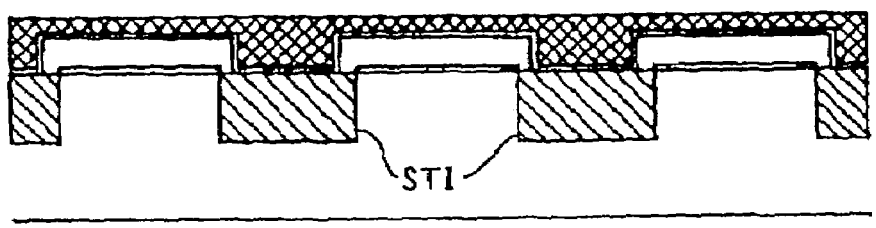

Next, referring to FIGS. 8(d), 13(b) and 17(b), the metal layers which have been formed over the entire plane (i.e., W layer and TiN layer) are polished by means of a CMP (chemical mechanical polish) process in such a way that they will remain only on the gate sites of the peripheral transistor region and non-volatile memory cell region.

Next, a 900 nm BPSG film is formed blanketwise by means of CVD (chemical vapor0 deposition), followed by the formation of a contact hole, and after an electrode wire has subsequently been formed, a non-volatile semiconductor memory device is obtained.

An NOR-type non-volatile memory has been discussed in the foregoing application embodiment (FIGS. 5 through 8, FIGS. 9 through 13, and FIGS. 14 through 17), whereas in the case of an NAND-type non-volatile memory, the SAS (self-aligned source) etching process shown in FIGS. 9 through 13 can be dispensed with, and therefore its processes can be explained with reference to FIGS. 5 through 8 and FIGS. 9 through 13 alone. A metal silicide process (formation of a metal reactive layer on a source-drain diffusion layer) has, furthermore, been disclosed (FIGS. 5 through 8, FIGS. 9 through 13, and FIGS. 14 through 17) in the present application embodiment, but even when the present invention is applied to a non-metal silicide process, similar effects can be achieved. Incidentally, the dummy gate (second polycrystalline silicon film) is not limited to a polycrystalline silicon film so long as a proper etching selection ratio can be secured in relation to the first polycrystalline silicon film or dummy gate insulating film.

Next, another application example of the present invention will be explained with reference to FIGS. 5 through 7 and FIGS. 18 and 19. Its processes up to an intermediate stage are identical to the aforementioned processes shown in FIG. 5(a) through FIG. 7(c), and therefore, FIGS. 5 through 7, which have already been referred to during the previous explanations, will be referred to once again. FIGS. 18 and 19 show cross-sectional views [D-D' direction] of an element region realm of the second application example based on a damascene gate technique, and they show cross-sectional views of the element region realm during the respective processes shown in FIGS. 18(b) through 19(a), which follow the process shown in FIG. 7(c), in proper order.

First, a thermal oxide film (SiO$_2$) and an insulating film (e.g., Si$_3$N$_4$, etc.) are grown above a semiconductor substrate of a given electroconductivity type (P$^+$) at thicknesses of 12 nm and 200 nm, respectively, and subsequently, a 300 nm channel is formed in the isolating region by using it as a hard mask. A 700 nm oxide film (e.g., HDP, etc.) is deposited on this channel and then planarized by means of a CMP (chemical mechanical polish) process (STI: Shallow trench insulation). Next, the thermal oxide film (SiO$_2$), which serves as a stopper film, and the insulating film (Si$_3$N$_4$) are removed. As shown in the steps of FIG. 5(b).

Next, referring to FIG. 5(c), an oxide film whose thickness is 10 nm is formed based on the thermal oxidation method as the first gate insulating film of the non-volatile memory (tunnel gate insulating film, TNOX).

Figure 5D:
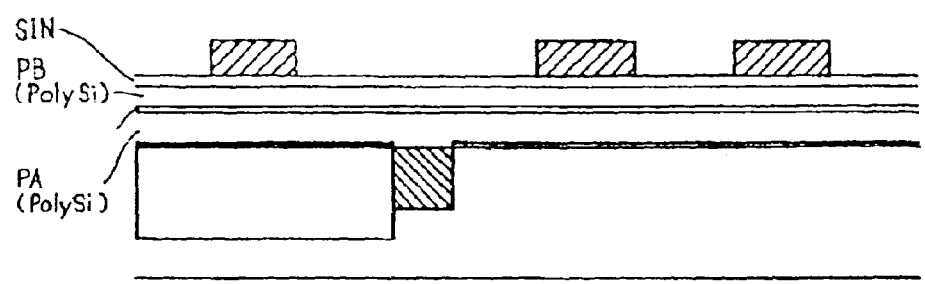

Next, referring to FIG. 5(d), a first polycrystalline silicon film (including DAS) whose thickness may, for example, be 90 nm is formed over the entire plane, and a 20 nm oxide film is formed above the aforementioned first polycrystalline silicon film as a dummy gate insulating film [insulating film in the PA (first wire layer)-PB (second wire layer) gap]. Next, a 100 nm second polycrystalline silicon film (dummy control gate which includes DAS) is formed, and a 150 nm SiN film which serves not only as an anti-reflection film but also as a stopper film during a SAS (self-aligned source) etching operation is deposited immediately above it based on a photolithographic technique.

A floating gate electrode and a control gate electrode are formed patternwise in each of the peripheral transistor region and non-volatile memory cell region.

Next, a source-drain diffusion layer (n$^+$ diffusion layer) for the non-volatile memory cell region is formed in a self-matching fashion based on an impurity introduction technique which uses arsenic, whose electroconductivity is the opposite of that of the substrate, at an acceleration voltage of 50 keV and at a dosage of $3.0 \times 10^{15}$ dose/cm$^2$.

Next, a 100 nm SiN film is grown based on the chemical vapor deposition method, followed by the anisotropic etching (100 nm etching) of the entire plane, as a result of which side wall insulating films are formed on the gate electrode side wall of the peripheral transistor region and on the side walls of the floating gate electrode, dummy gate insulating film, and dummy control gate electrode of the non-volatile memory cell region. Next, the isolating insulation film is partially removed by means of dry etching (300 nm+10% over) by using the gate of the non-volatile memory cell region as a partial mask (SAS: Self-aligned source). Next, a source-drain diffusion layer ($n^+$ diffusion layer) for the peripheral transistor region is formed in a self-matching fashion based on an impurity introduction technique which uses arsenic, whose electroconductivity is the opposite of that of the substrate, at an acceleration voltage of 60 keV and at a dosage of $3.0 \times 10^{15}$ dose/$cm^2$. The impurity is concomitantly introduced to the segment from which the isolating insulation film has previously been removed, as a result of which a source region for the transistor and a common source wire region are formed in self-matching fashions (formation of a common source region). As shown in FIG. 6(b).

Figure 6C:
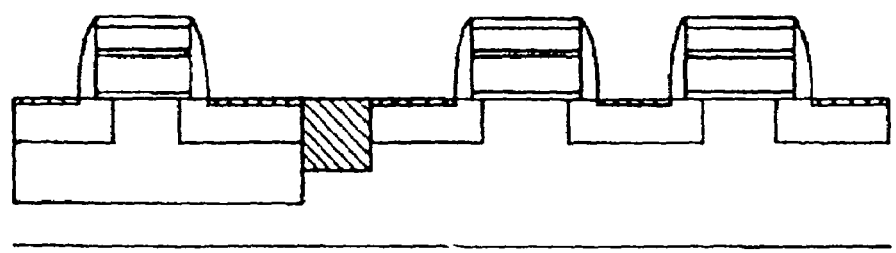

Next, referring to FIG. 6(c), Co (9 nm)+TiN (30 nm) is grown over the entire plane, and after a metal reactive layer (CoSi layer in this case) has been formed by means of RTA (500° C., $N_2$, 30 sec.), unreacted (Co+TiN) is etched over the entire plane, followed by an additional RTA (800° C., $N_2$, 30 sec.) annealing operation [formation of a metal reactive layer above the source drain diffusion layer (silicide process)].

Next, referring to FIG. 7(a), an interlayer insulating film (SiO, 1,000 nm) is formed.

Subsequently, referring to FIG. 7(b), 800 nm is subsequently etched back by means of a CMP (chemical mechanical polish) process until the dummy gate (second polycrystalline silicon film) becomes bared [SiN above the second polycrystalline silicon film and SiN on its side wall are partially polished and removed during this CMP (chemical mechanical polish) process].

Next, referring to FIG. 7(c), the dummy control gate (second polycrystalline silicon film) of the peripheral transistor region and non-volatile memory cell region and the dummy gate insulating film underneath it are removed.

Figure 18A:
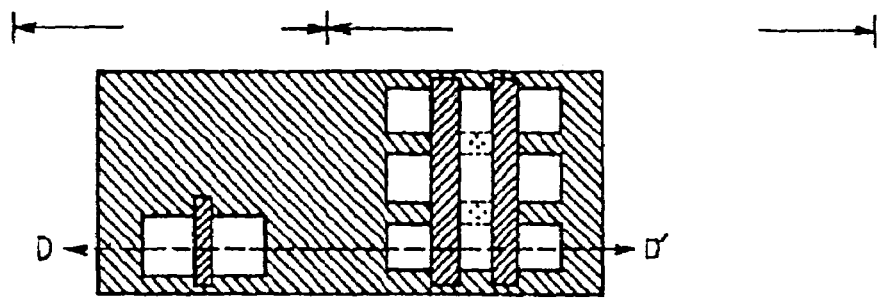
FIGS. 18(a)-18(d) are schematic demonstrational diagrams pertaining to a method for manufacturing a semiconductor device which complies with the second application embodiment of the present invention.
Figure 18B:
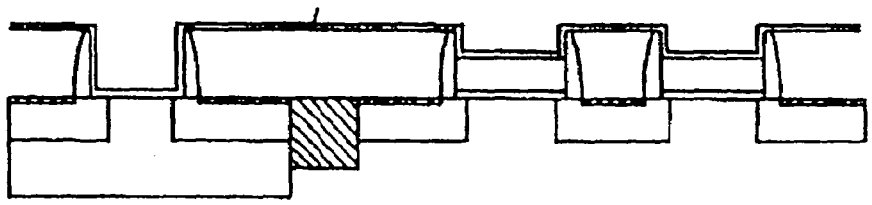

Next, the non-volatile memory cell region (area other than the first polycrystalline silicon film-first polycrystalline silicon film gap secured for isolating purposes) is masked by using a photolithographic technique, and the first polycrystalline silicon film and first gate insulating film of the peripheral transistor region and non-volatile memory cell region are partially removed by means of an etching process (process whereby the floating gate region of the non-volatile memory cell region is induced to remain). As shown in FIG. 18(b).

Figure 18C:
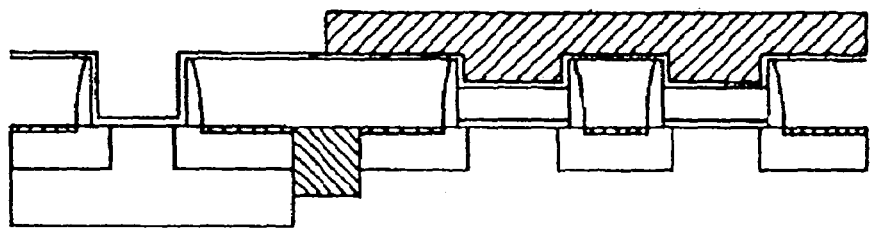

Next, referring to FIG. 18(c), a 10 nm insulating film (e.g., ONO film, etc.) is formed on the channel of the aforementioned etched segment.

Figure 18D:
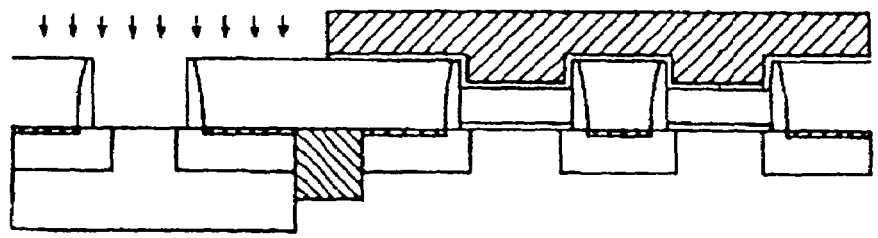

Referring to FIG. 18(d), the non-volatile memory cell region alone is masked based on a photolithographic technique.

Referring to FIG. 19(a), the insulating film is removed from the peripheral transistor region by means of an etching process.

Next, referring to FIG. 19(b), a 1.5 nm thin $SiO_2$ film is formed on each of the peripheral transistor region and non-volatile memory cell region, followed by the formation of a 2 nm SiON layer, and subsequently, a 6 nm high-permittivity film (e.g., $Ta_2O_5$) is formed above it as a gate insulating film. In this case, the gate insulating film of the peripheral transistor region is constituted by only one insulating film layer, whereas an insulating film laminate structure is present in the non-volatile memory cell region [it is also possible to embody a constitution wherein the peripheral transistor is constituted by a $Ta_2O_5$/non-volatile memory cell region and wherein the PA (first wire layer)-PB (second wire layer) gap insulating film is constituted by ONO in this context by removing $Ta_2O_5$ while the peripheral transistor region alone is being blanketed with a resist).

Next, referring to FIG. 19(c), a metal layer which may, for example, be constituted by TiN (50 nm) is formed above it, followed by the formation of a W layer (300 nm) above it.

Next referring to FIG. 19(d), the metal layers which have been formed over the entire plane are polished by means of a CMP (chemical mechanical polish) process in such a way that they will remain only on the respective gate sites of the peripheral transistor region and non-volatile memory cell region.

Next, a 900 nm BPSG film is formed.

A contact hole is subsequently formed, followed by the formation of an electrode wire, as a result of which a non-volatile semiconductor device is obtained [cross-sectional views of the isolating region of Application Example 2 are not graphically shown because they are identical to those of Application Example 1 shown in FIGS. 5 through 8, with the exception of the constitutions and thicknesses of the second gate insulating films of the peripheral transistor region anti non-volatile memory cell region].

In an alternative embodiment for manufacturing a non-volatile semiconductor memory device (not shown in the figures), the following procedures are carried out: After the first layer of the gate insulating film of the peripheral transistor region and the insulating film laminate structure of the non-volatile memory cell region have been formed as shown in FIG. 19(a) in the second application embodiment explained above, the high-permittivity film of the non-volatile memory cell region is selectively removed by means of a photolithographic technique while the peripheral transistor region alone is being masked (subsequent processes are identical to those of the second application embodiment), as a result of which the gate insulating film and the PA (first wire layer)-PB (second wire layer) gap insulating film of the peripheral transistor region differ. An NOR-type non-volatile memory has, furthermore, been disclosed in the second application embodiment discussed above (FIG. 19), whereas in the case of a NAND-type non-volatile memory, the SAS (self-aligned source) etching process can be dispensed with, and therefore, its processes can be explained with reference to the figures excluding FIGS. 9 through 13. A metal silicide process (formation of a metal reactive layer above a source-drain diffusion layer) has, furthermore, been discussed in the aforementioned second application embodiment (FIGS. 18 and 19), but similar results can also be achieved when the same principle is applied to a non-metal silicide process.

Next, the third application embodiment of the present invention will be explained sequentially with reference to FIGS. 20 through 23.

FIGS. 20 through 23 show cross-sectional views [E-E' direction] of the element region realm of the third application embodiment of the present invention based on a damascene gate technique, and the cross-sectional views of the element region realm based on the damascene gate format during the respective processes, are shown in FIGS. 20(a)-23(b) in proper order.

Figure 20A:
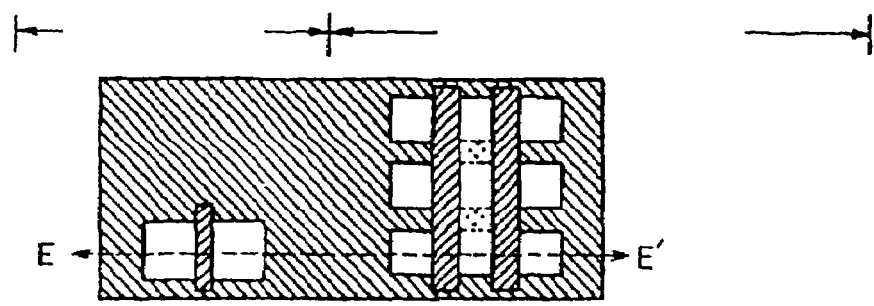
FIGS. 20(a)-20(d) are schematic demonstrational diagrams pertaining to a method for manufacturing a semiconductor device which complies with the third application embodiment of the present invention.
Figure 20B:
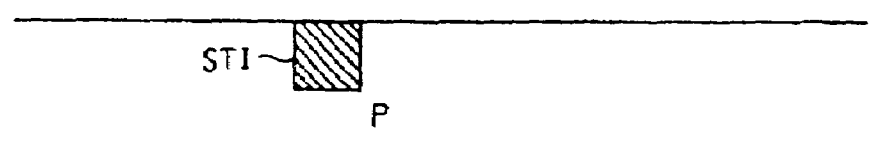

First, referring to FIG. 20(b), a thermal oxide film ($SiO_2$) and an insulating film (e.g., $Si_3N_4$, etc.) are grown above a semiconductor substrate of a given electroconductivity ($P^{1-1}$) at thicknesses of 12 nm and 200 nm, respectively, and a 300 nm channel is subsequently formed on the isolating region by means of etching by using it as a hard mask. A 700 nm oxide film (e.g., HDP, etc) is deposited on this channel and then planarized by means of a CMP (chemical mechanical polish) process (STI: Shallow trench insulation). Next, the thermal oxide film ($SiO_2$), which serves as a stopper film, and the insulating film ($Si_3N_4$) are removed.

Figure 20C:
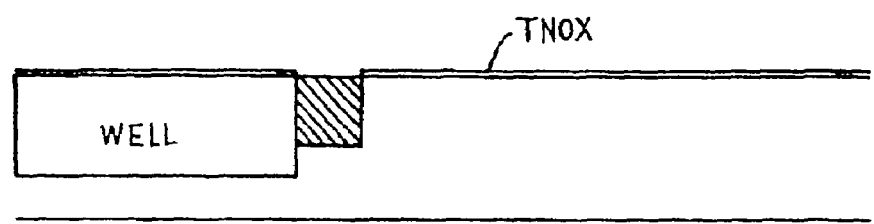
Figure 20D:
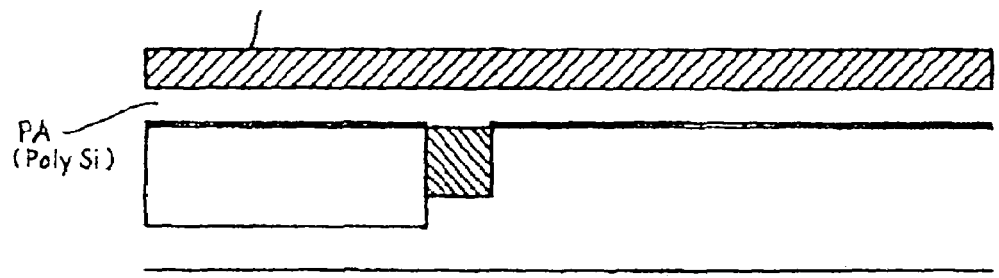

Next, referring to FIG. 20(c), an oxide film whose thickness is 10 nm is formed based on the thermal oxidation method as the first gate insulating film (tunnel gate insulating film, TNOX) of the non-volatile memory cell.

Figure 21A:
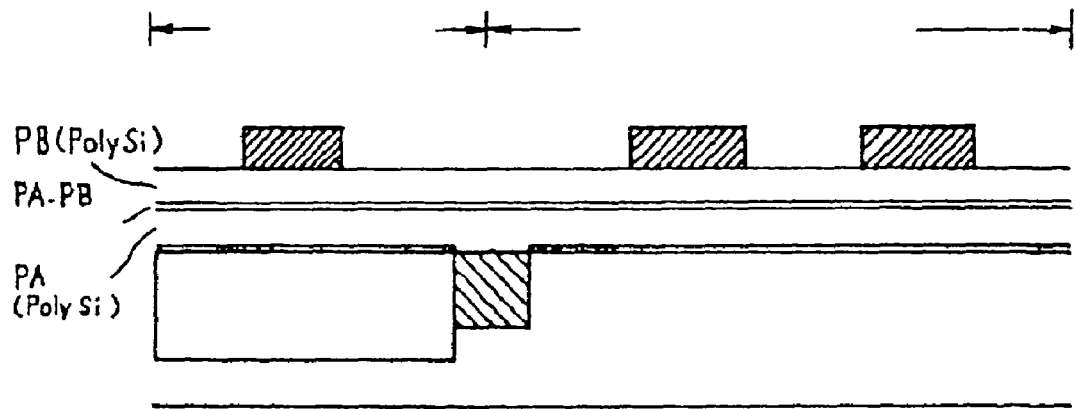
FIGS. 21(a)-21(d) are schematic demonstrational diagrams pertaining to the method for manufacturing a semiconductor device which complies with the third application embodiment of the present invention.

Next, referring to FIG. 21(a), a first polycrystalline silicon film whose thickness may, for example, be 90 nm, is formed over the entire plane, and a resist for the first polycrystalline silicon film (floating gate) is subsequently etched and patterned based on a photolithographic technique, as a result of which the first polycrystalline silicon film of the non-volatile memory cell region is patterned. It is also possible to use a doped amorphous silicon film in place of said first polycrystalline silicon film.

Figure 21B:
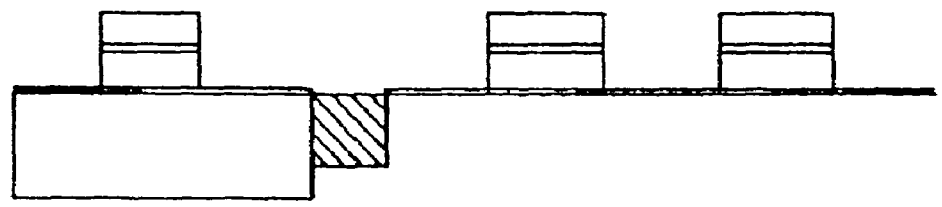

Next, referring to FIG. 21(b), a 20 nm oxide film is formed above the aforementioned first polycrystalline silicon film as a gate insulating film [PA (first wire layer)-PB (second wire layer) gap insulating film]. Next, a 100 nm second polycrystalline silicon film (control gate) is formed by using a photolithographic technique. It is also possible to use a doped amorphous silicon film in place of said second polycrystalline silicon film.

A floating gate electrode and a control gate electrode are formed patternwise in each of the peripheral transistor region and non-volatile memory cell region.

Next, a source-drain diffusion layer ($n^+$ diffusion layer) for the non-volatile memory cell region is formed in a self-matching fashion based on an impurity introduction technique which uses arsenic, whose electroconductivity is the opposite of that of the substrate, at an acceleration voltage of 50 keV and at a dosage of $3.0 \times 10^{15}$ dose/$cm^2$.

Figure 21C:
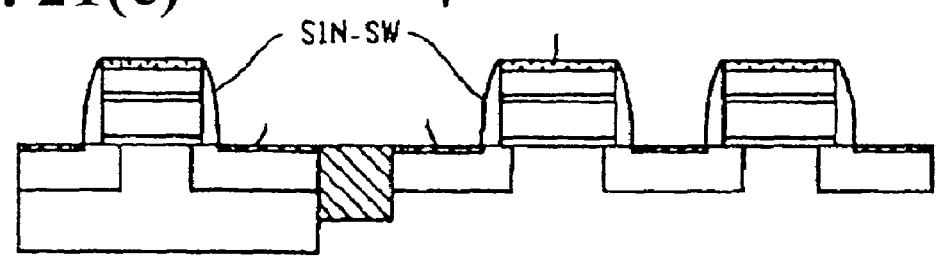

Next, referring to FIG. 21(c), a 100 nm SiN film is grown based on the chemical vapor deposition method, followed by its anisotropic etching, as a result of which side wall insulating films are formed on the side wall of the gate electrode of the peripheral transistor region and on the side walls of the floating gate electrode, second gate insulating film, and control gate electrode of the non-volatile memory cell region. Next, a source-drain diffusion layer ($n^+$ diffusion layer) for the non-volatile memory cell region is formed in a self-matching fashion based on am impurity introduction technique which uses arsenic, whose electroconductivity is the opposite of that of the substrate, at an acceleration voltage of 60 keV and at a dosage of $3.0 \times 10^{15}$ dosed/$cm^2$.

Figure 21D:
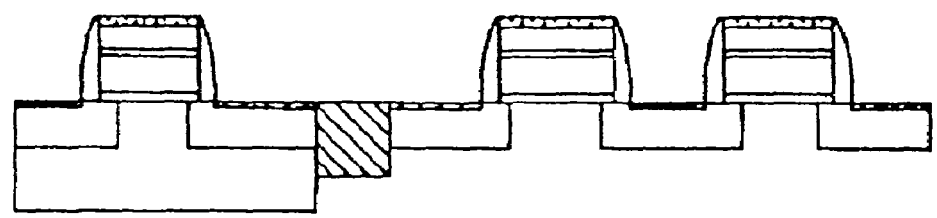

Next, referring to FIG. 21(d), a [Co (cobalt, 9 nm)+TiN (titanium nitride, 30 nm)] is grown over the entire plane, and after a metal reactive layer (CoSi layer in this case) has been formed above it by means of RTA (rapid thermal annealing; 500° C., $N_2$ atmosphere, 30 sec.), the unreacted [Co (cobalt)+TiN (titanium nitride)] is etched back over the entire plane, and subsequently, an additional RTA (rapid thermal annealing; 800° C., $N_2$ atmosphere, 30 sec.) operation is carried out [formation of metal reactive layers above the source-drain region and above the gate (silicide process)].

Figure 22A:
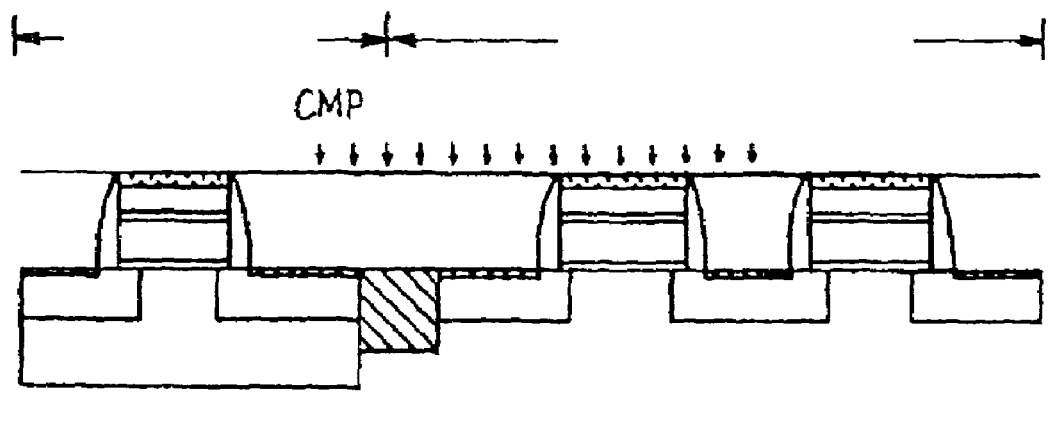
FIGS. 22(a)-22(c) are schematic demonstrational diagrams pertaining to the method for manufacturing a semiconductor device which complies with the third application embodiment of the present invention.

Next, referring to FIG. 22(a), a bulk interlayer insulating film (SiO, 1,000 nm) is formed.

Figure 22B:
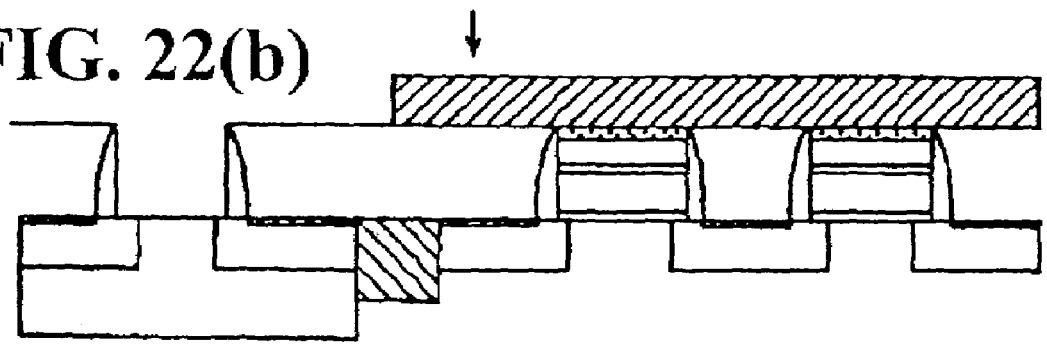

Subsequently, referring to FIG. 22(b), 800 nm of the bulk interlayer insulating film is etched back by means of a CMP (chemical mechanical polish) process until the gate becomes bared.

Figure 22C:
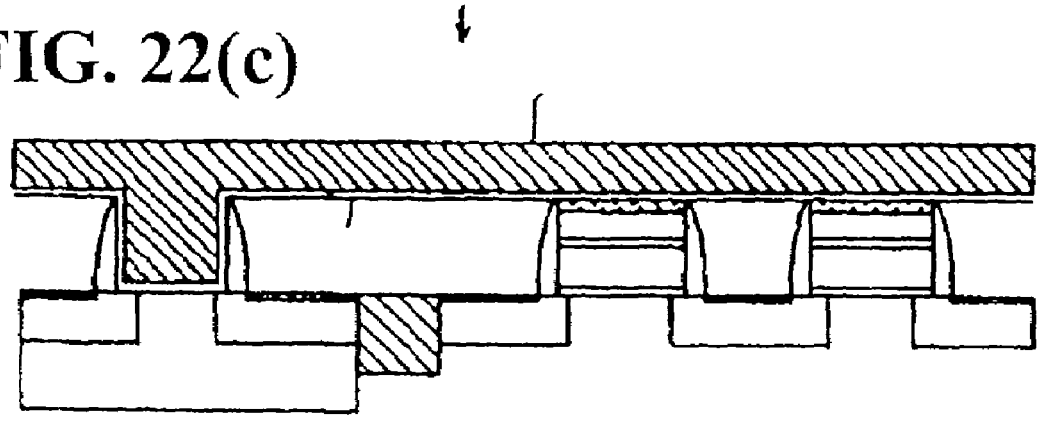

Next, referring to FIG. 22(c), a resist pattern which blankets the non-volatile memory cell is formed based on a photolithographic technique, and the [CoSi/second polycrystalline silicon film/gate insulating film underneath the second polycrystalline silicon film/first polycrystalline silicon film/TNOX film] portion of the peripheral transistor region is removed.

Next, referring to FIG. 23(a), a 1.5 nm thin $SiO_2$ film is formed above the channel of the aforementioned etched segment, followed by the formation of a 2 nm SiON film, and a 56 nm high-permittivity film (e.g., $Ta_2O_5$) is formed above it as a gate insulating film. After a metal layer (e.g., TiN, 50 nm) has been formed above it, a layer which may, for example, be constituted by W (300 nm) is formed above it.

Next, referring to FIG. 23(b), the metal layers (W layer and TiN layer) which have been formed over the entire plane are polished by means of a CMP (chemical mechanical polish) process in such a way that the metal gate will remain only in the gate site of the peripheral transistor region.

Next, a 900 nm BPSG (boro-phospho-silicate glass) film is formed. After a contact hole has been further formed, an electrode wire is formed, as a result of which a non-volatile semiconductor memory device is obtained.

The silicide process (formation of metal reactive layers above the source-drain diffusion layer and above the gate electrode) has been disclosed (FIGS. 20 through 23) with regard to the third application embodiment discussed above, but similar effects can also be achieved in the case of a non-metal silicide process.

Next, the respective manufacturing processes of the semiconductor device of the fourth application embodiment of the present invention will be explained with reference to FIGS. 5 through 7 and FIGS. 24 and 25. Its processes up to an intermediate stage are identical to the aforementioned processes shown in FIGS. 5(a) through 7(a), and therefore, FIGS. 5 through 7, which have already been referred to during the previous explanations, will be referred to once again.

Figure 24A:
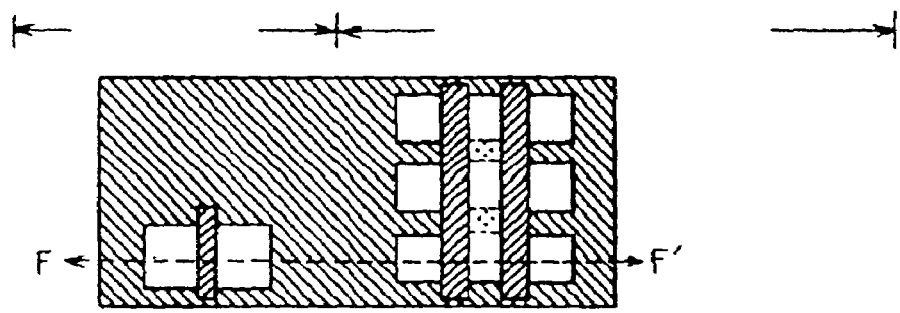
FIGS. 24(a)-24(d) are schematic demonstrational diagrams pertaining to a method for manufacturing a semiconductor device which complies with the fourth application embodiment of the present invention.
Figure 24B:
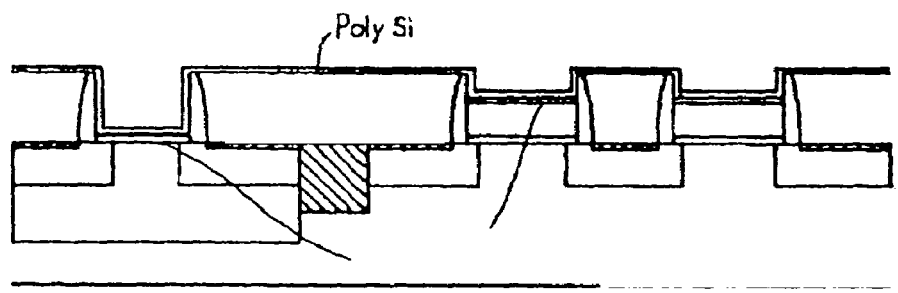
Figure 24C:
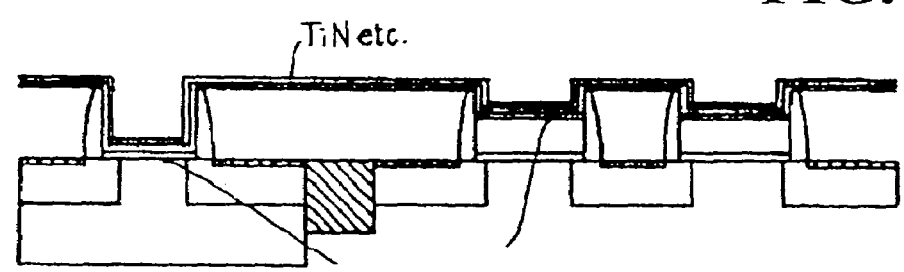
Figure 24D:
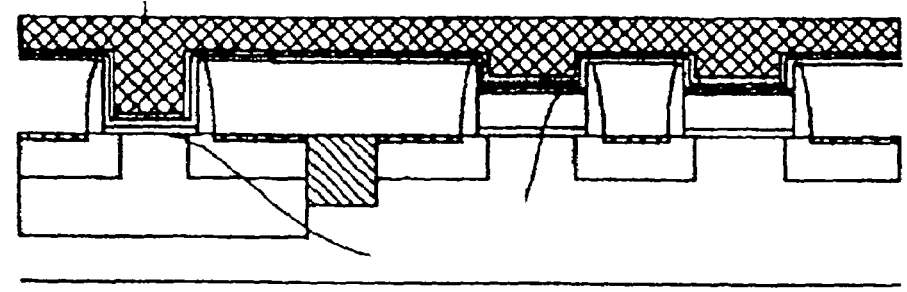
Figure 25A:
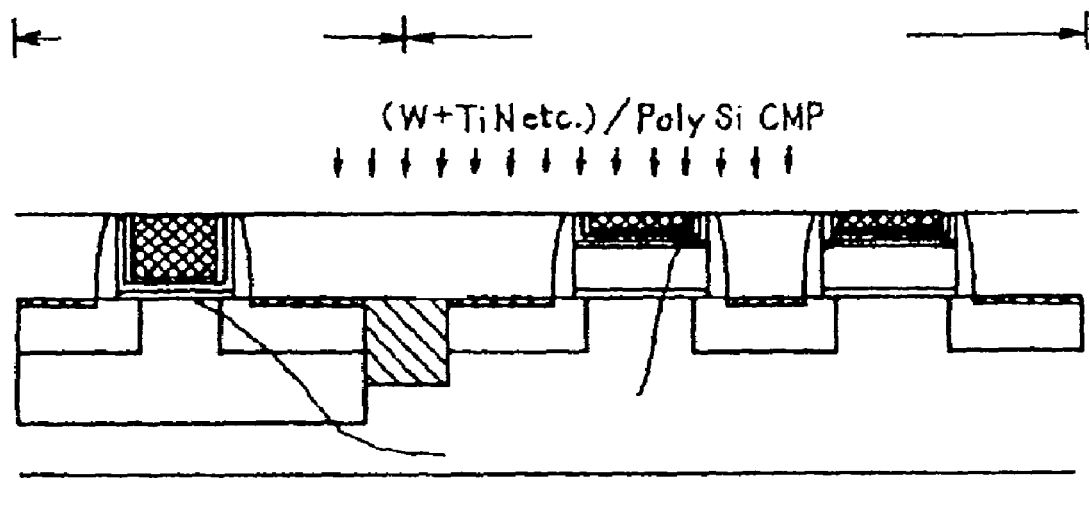
FIGS. 25(a)-25(b) are schematic demonstrational diagrams pertaining to the method for manufacturing a semiconductor device which complies with the fourth application embodiment of the present invention.
Figure 25B:
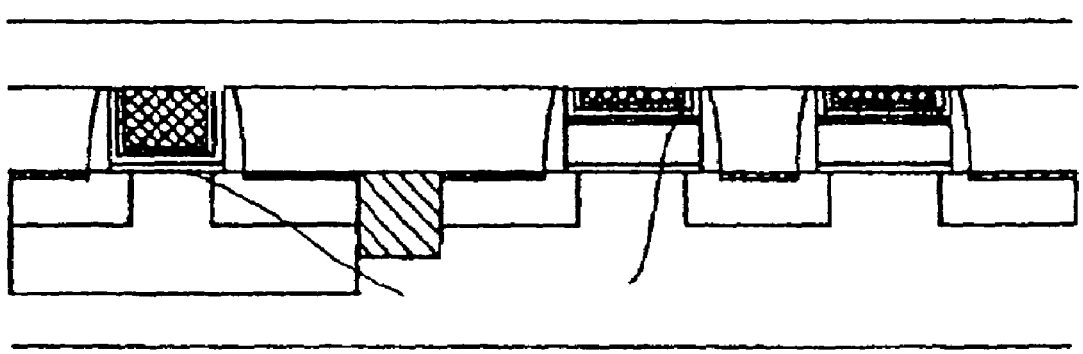
Figure 26A:
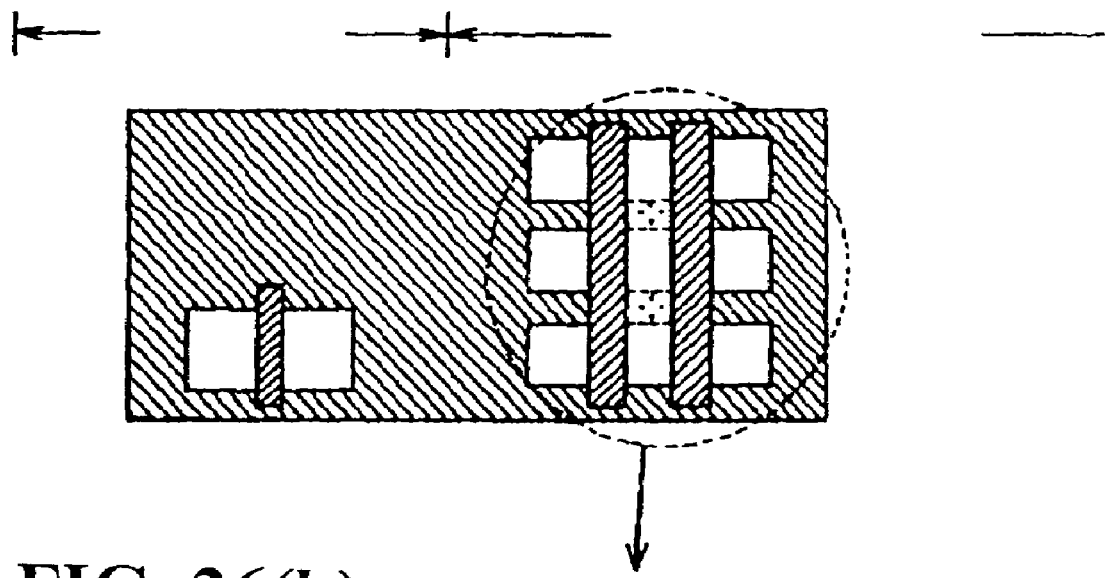
FIGS. 26(a)-26(b) are schematic demonstrational diagram pertaining to a method for manufacturing a semiconductor device which complies with the first through fourth application embodiments of the present invention.
Figure 26B:
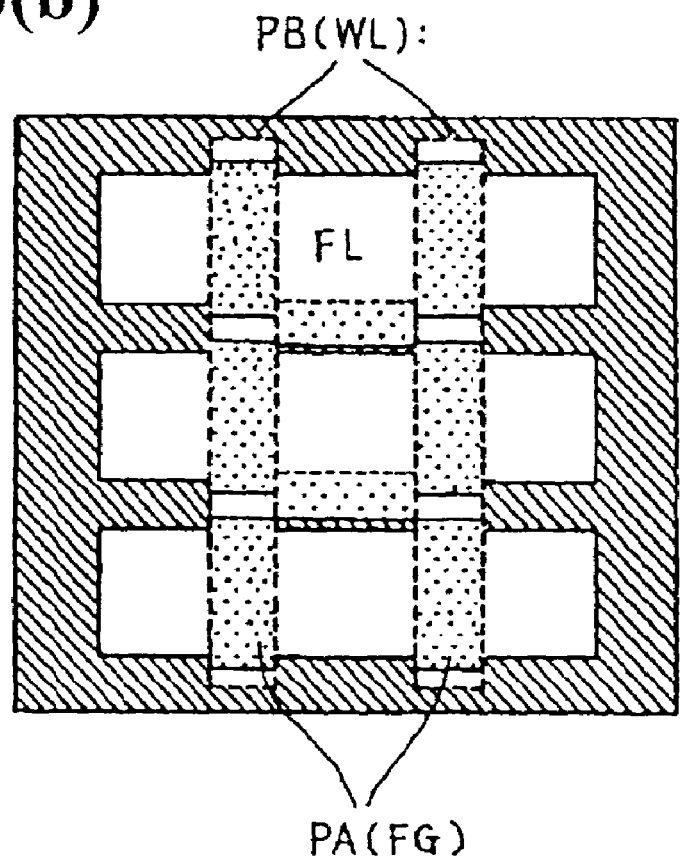
Figure 27A:
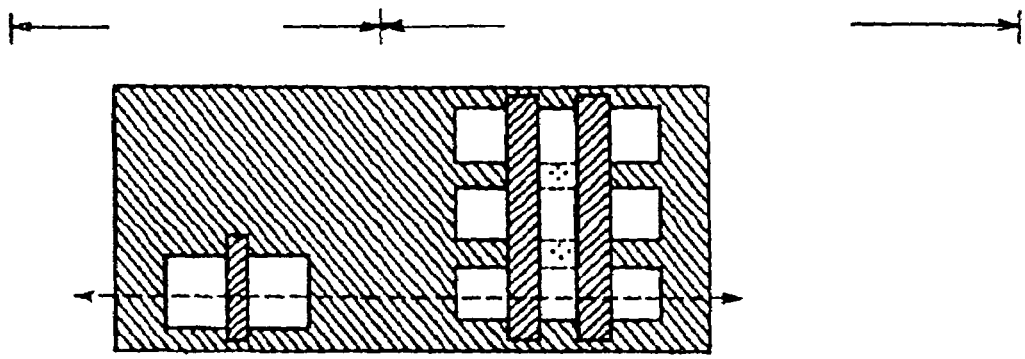
FIGS. 27(a)-27(d) are schematic demonstrational diagrams pertaining to a method for manufacturing a semiconductor device which complies with the fifth application embodiment of the present invention.
Figure 27B:
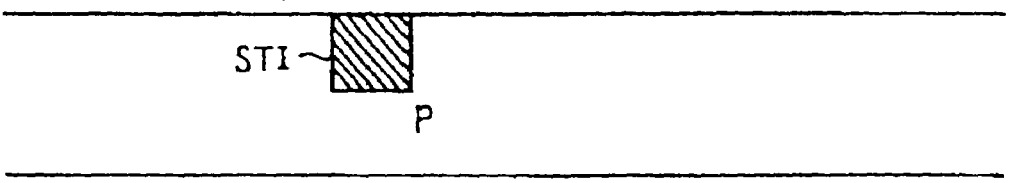
Figure 27C:
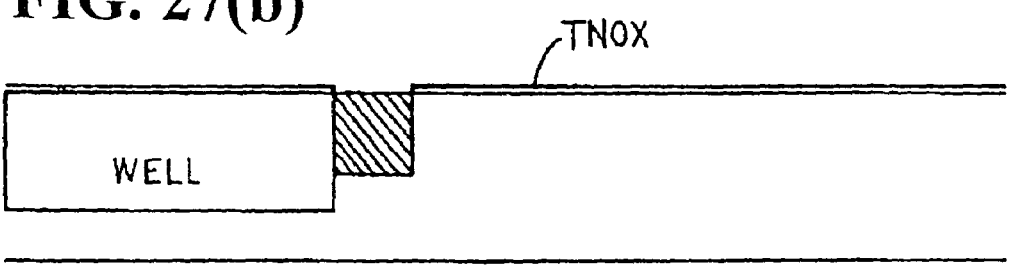
Figure 27D:
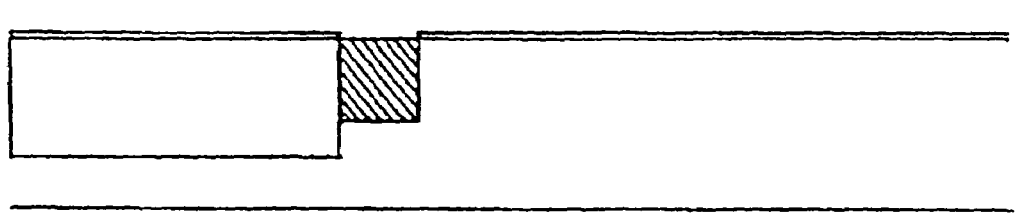

FIGS. 24 and 25 show cross-sectional views [F-F' direction] of the element region realm of the fourth application embodiment of the present invention based on a damascene gate technique, and the cross-sectional views of the element region realm based on the damascene gate format during the respective processes are shown in FIGS. 24(a)-FIG. 25(b) in proper order.

First, a thermal oxide film ($SiO_2$) and an insulating film (e.g., $Si_3N_4$, etc.) are grown above a semiconductor substrate of a given electroconductivity type ($P^+$) at thicknesses of 12 nm and 200 nm, respectively, and a 300 nm channel is formed on the isolating region by means of etching by using it as a hard mask. A 700 nm oxide film is deposited on this channel, and the surface of the oxide film is polished and planarized based on the CMP (chemical mechanical polish) method. A shallow trench isolation (STI) is formed as a result of this flattening process. Regarding the types of oxide films hereby deposited at the thickness of 700 nm, the use of an HDP film (high-density plasma CVD oxide film) is especially desirable in that it is capable of achieving a high density. Next, the thermal oxide film ($SiO_2$), which serves as a stopper films and the insulating film ($Si_3N_4$) are removed. As shown in FIG. 5(b).

Next, referring to FIG. 5(c), an oxide film whose thickness is 10 nm is formed based on the thermal oxidation method as the first gate insulating film of the non-volatile memory (tunnel gate insulating film, TNOX).

Next, referring to FIG. 6(a), a first polycrystalline silicon film whose thickness may, for example, be 90 nm is formed over the entire plane, and a 20 nm oxide film is formed above the aforementioned first polycrystalline silicon film as a gate insulating film [PA (first wire layer)-PB (second wire layer) gap insulating film]. Next, a 100 nm second polycrystalline silicon film (control gate) is formed, and a 150 nm SiN (silicon nitride) film which serves not only as an anti-reflection film but also as a stopper film during an SAS (self-aligned source) etching operation is deposited immediately above it by using a photolithographic technique. It is also possible to use a doped amorphous silicon film in place of the polycrystalline silicon of said first or second polycrystalline silicon film.

A floating gate electrode and a control gate electrode are formed patternwise in each of the peripheral transistor region and non-volatile memory cell region.

Next, a source-drain diffusion layer ($n^+$ diffusion layer) for the non-volatile memory cell region is formed in a self-matching fashion based on an impurity introduction technique which uses arsenic, the electroconductivity of which is the opposite of that of the substrate, at an acceleration voltage of 50 keV and at a dosage of $3.0 \times 10^{15}$ dose/cm$^2$.

Referring to FIG. 6(b), a 100 nm SiN (silicon nitride) film is subsequently grown based on the chemical vapor deposition method, followed by the anisotropic etching of the entire plane (etch-back over a depth of 100 nm), as a result of which side wall insulating films are formed on the side wall of the gate electrode of the peripheral transistor region and on the side walls of the floating gate electrode, second gate insulating film, and control gate electrode of the non-volatile memory cell region. Next, the isolating insulation film is partially removed by means of dry etching (300 nm+10% over) by using the gate of the non-volatile memory cell region as a partial mask (SAS: Self-aligned source). Next, a source drain diffusion layer ($n^+$ diffusion layer) for the peripheral transistor region is formed in a self-matching fashion based on an impurity introduction technique which uses arsenic, whose electroconductivity is the opposite of that of the substrate, at an acceleration voltage of 60 keV and at a dosage of $3.0 \times 10^{15}$ dose/cm$^2$. The impurity as concomitantly introduced to the segment from which the isolating insulation film has previously been removed, as a result of which a source region for the transistor and a common source wire region are formed in self-matching fashion (formation of a common source region).

Next, referring to FIG. 6(c), [Co (9 nm)+TiN (30 nm)] is grown over the entire plane, and after a metal reactive layer (CoSi layer in this case) has been formed by means of RTA (500° C., N$_2$, 30 sec.), unreacted (Co+TiN) is etched over the entire plane, followed by an additional RTA (800° C., N$_2$, 30 sec.) annealing operation [formation of a metal reactive layer above the S/D diffusion layer (silicide process)].

Next, referring to FIG. 7(a), an interlayer insulating film (SIO: 1,000 nm) is formed.

Subsequently, referring to FIG. 7(b), 800 nm is subsequently etched back by means of a CMP (chemical mechanical polish) process until the dummy gate (second polycrystalline silicon film) becomes bared [SiN above the second polycrystalline silicon film and SiN on its side wall are partially polished and removed during this CMP (chemical mechanical polish) process].

Next, referring to FIG. 7(c), the dummy control gate (second polycrystalline silicon film) of each of the peripheral transistor region and non-volatile memory cell region and the dummy gate insulating film underneath it are removed.

Next, referring to FIG. 24(b), the non-volatile memory cell region (area other than the first polycrystalline silicon film-first polycrystalline silicon film gap secured for isolating purposes) is masked by using a photolithographic technique, and the first polycrystalline silicon layer and first gate insulating film of each of the peripheral transistor region and non-volatile memory cell region are partially removed by means of an etching process (process whereby the element region of the non-volatile memory cell region is induced to remain).

Next, referring to FIG. 24(c), a thin 1.5 nm SiO$_2$ film is formed above the channel of the aforementioned etched segment, and after a 2 nm SION layer has subsequently been formed above it, a 6 ml high-permittivity film (e.g., Ta$_2$O$_5$) is formed above it as a gate insulating film, as a result of which a third polycrystalline silicon film is formed.

Next, referring to FIG. 24(d), a metal layer (e.g., TiN, 50 nm) is formed above it.

Referring to FIG. 25(a), a layer which may, for example, be constituted by W (300 nm) is formed.

Next, referring to FIG. 25(b), the metal layers (W layer and TiN layer) which have been formed over the entire plane are polished by means of a CMP (chemical mechanical polish) process in such a way that only the gate sites of the peripheral transistor region and non-volatile memory cell region will remain.

Next, a 900 nm BPSG film is formed.

Next, a contact hole is formed, and after an electrode wire has subsequently been formed, a non-volatile semiconductor memory device is obtained [it is also possible to differentiate the control gate and floating gate materials between the non-volatile memory cell region and peripheral transistor region by removing the polycrystalline Si film of the peripheral transistor region after the formation of the third polycrystalline silicon film while the non-volatile memory cell region alone is being blanketed with a resist, by removing said resist, and by then forming a TiN [layer] (50 nm) and a W layer (300 nm)].

In an alternative embodiment for manufacturing a non-volatile semiconductor memory device (not shown in the figures), the following procedures are carried out: After the third polycrystalline silicon film has been formed in Application Example 4 shown in FIG. 24(b), the third polycrystalline silicon film of the peripheral transistor region alone is etched and removed by means of a photolithographic technique while the non-volatile memory cell region alone is being masked (subsequent processes are identical to those of Application Example 4), as a result of which the gate electrode structure of the peripheral transistor region and the control gate electrode structure of the non-volatile memory cell region differ.

A NOR-type non-volatile memory has been graphically represented (FIG. 24) in the present application example, whereas in the case of a NAND-type non-volatile memory, no SAS (self-aligned source) etching process is involved, and therefore its processes can be explained with reference to the figures excluding FIGS. 9 through 13.

A metal silicide process (formation of a metal reactive layer above the S/D diffusion layer) has been graphically represented (FIG. 24) in the present application example, but a case of a non-metal silicide process is also within the scope of the present invention.

Next, the fifth application embodiment of the present invention will be sequentially explained with reference to FIGS. 27 through 33. FIGS. 27 through 33 show cross-sectional views [A-A' direction] of the element region realm of the fifth application embodiment of the present invention based on a damascene gate technique, and the cross-sectional views of the element region realm during the respective processes are thereby shown. Regarding the cross-sectional representations of these figures, the n-type transistor of the logic unit is shown on the left, whereas the cell transistor of the flash memory unit is shown on the right. As shown in FIG. 27(*b*).

The isolation region (2) is formed above the P-type semiconductor substrate (1) based on a conventionally-known LOCOS isolation method or trench isolation method. As shown in FIG. 27(*c*).

Next, referring to FIG. 27(*d*), the silicon oxide film, which is to be used as a tunnel oxide film for the flash memory, is formed at a thickness of approximately 10 nm based on a conventionally-known thermal oxidation method.

Figure 28A:
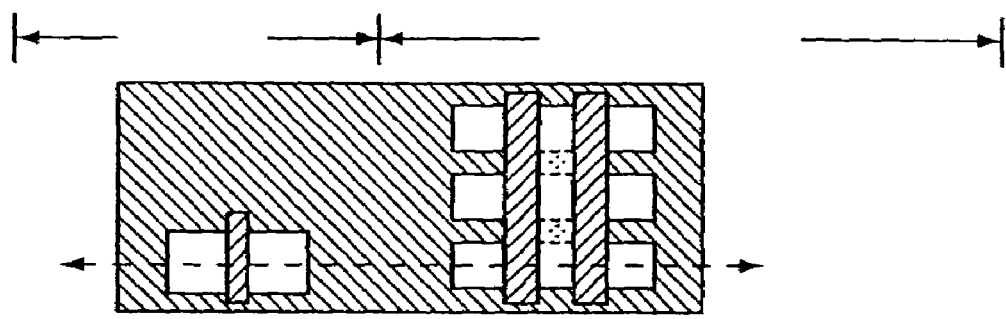
FIGS. 28(a)-28(c) are schematic demonstrational diagrams pertaining to a method for manufacturing a semiconductor device which complies with the fifth application embodiment of the present invention.
Figure 28B:
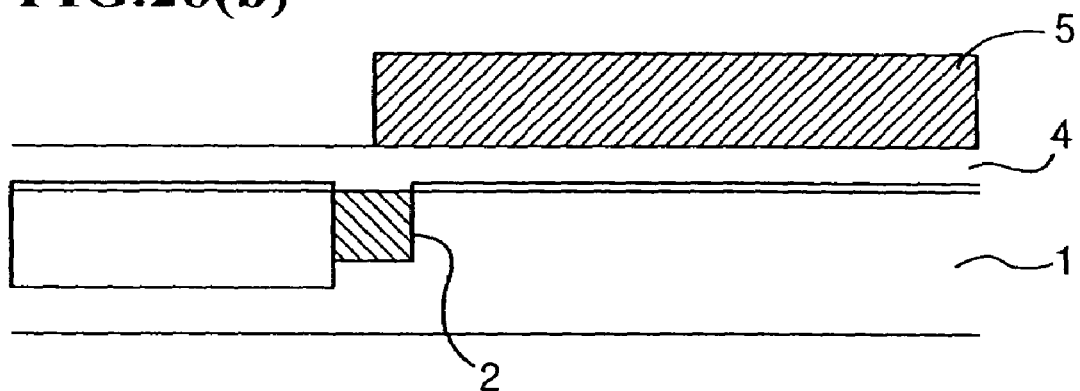
Figure 28C:
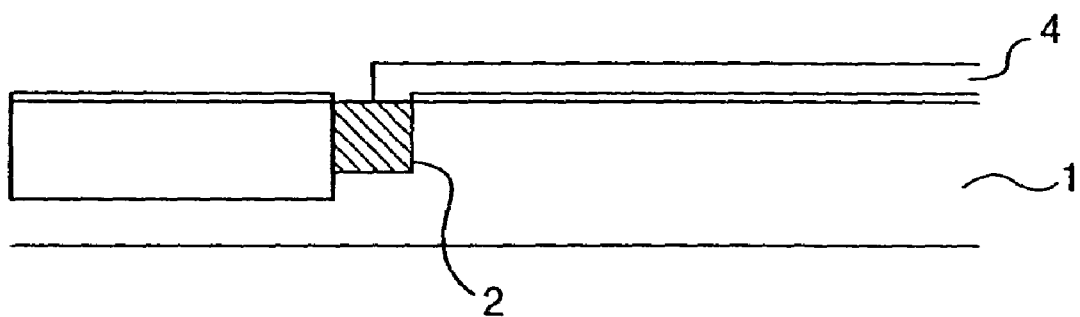

Referring to FIG. 28(*b*), the polycrystalline silicon layer (4), which includes phosphorus at a concentration of 2 to $6\times10^{20}$ [atoms/cm$^2$], is subsequently formed over the entire plane at a thickness of approximately 50 nm based on a conventionally-known CVD method.

Next, referring to FIG. 28(*c*), the resist pattern (6) is formed only above the flash memory unit based on a conventionally-known photolithographic method.

Not only a portion of the polycrystalline silicon layer (4) of the flash memory unit but also the polycrystalline silicon layer (4) and silicon oxide film of the logic unit are removed based on a conventionally-known etching method by using the resist pattern (5) as a mask, and subsequently, the resist pattern (5) is removed.

M, a result, the polycrystalline silicon layer (4) of the flash memory unit is formed in a striped fashion in a direction parallel to the isolation region (2), as the plane view of FIG. 28 indicates.

Figure 29A:
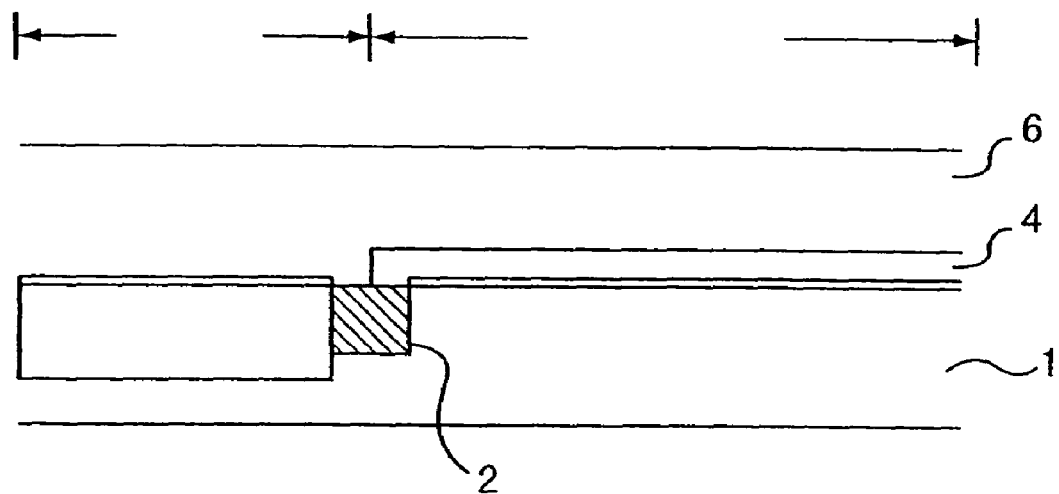
FIGS. 29(a)-29(b) are schematic demonstrational diagrams pertaining to the method for manufacturing a semiconductor device which complies with the fifth application embodiment of the present invention.
Figure 29B:
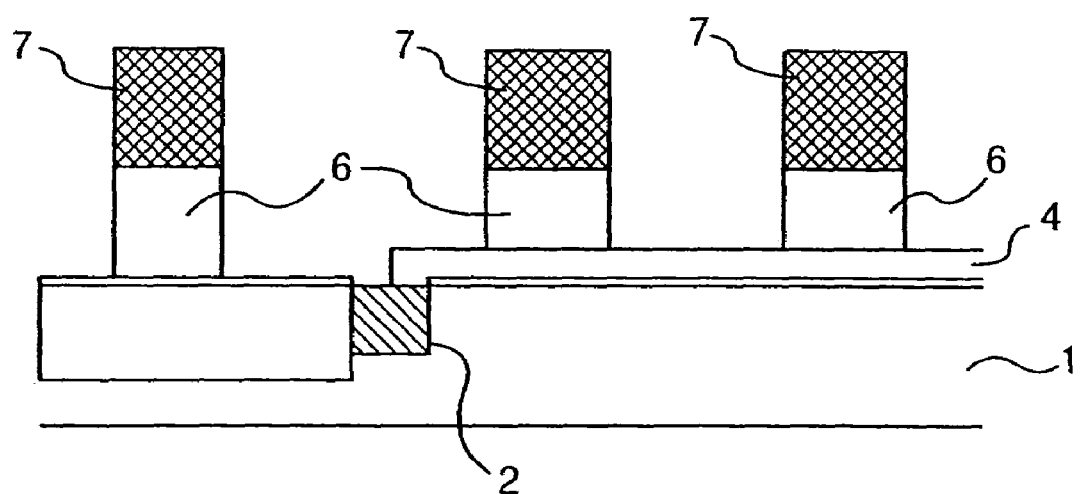

Next, referring to FIG. 29(*b*), the silicon nitride film (6) is formed at a thickness of approximately 250 nm based on a conventionally-known CVD method, and subsequently, approximately 100 nm of its surface layer is polished and removed based on a conventionally-known CMP (chemical mechanical polish) method.

Figure 30A:
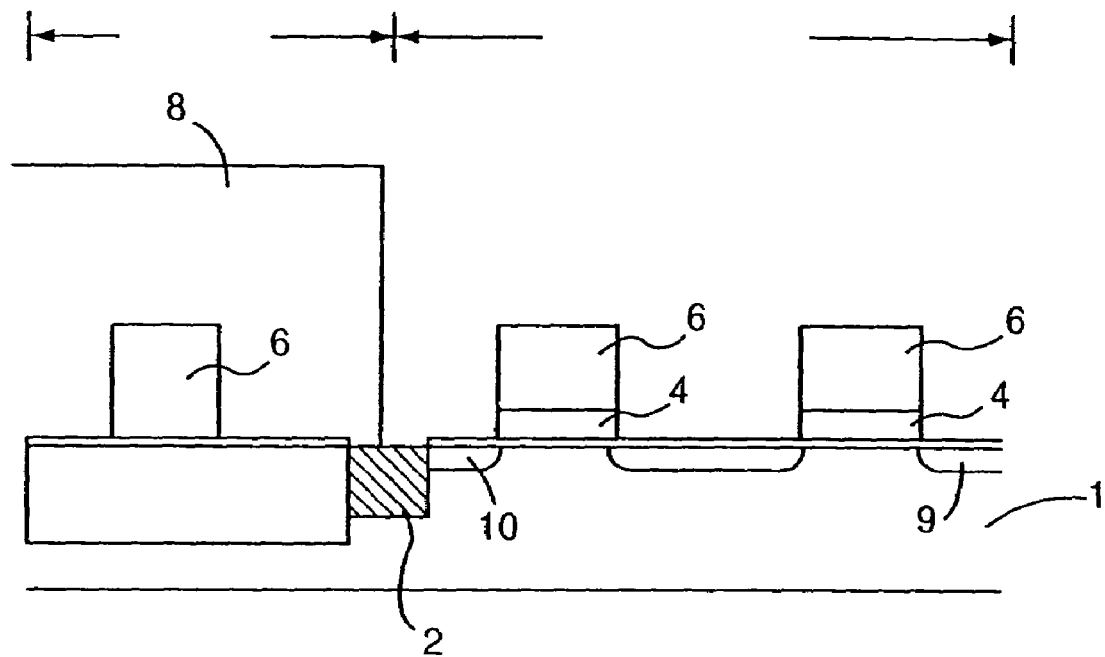
FIGS. 30(a)-30(b) are schematic demonstrational diagrams pertaining to the method for manufacturing a semiconductor device which complies with the fifth application embodiment of the present invention.
Figure 30B:
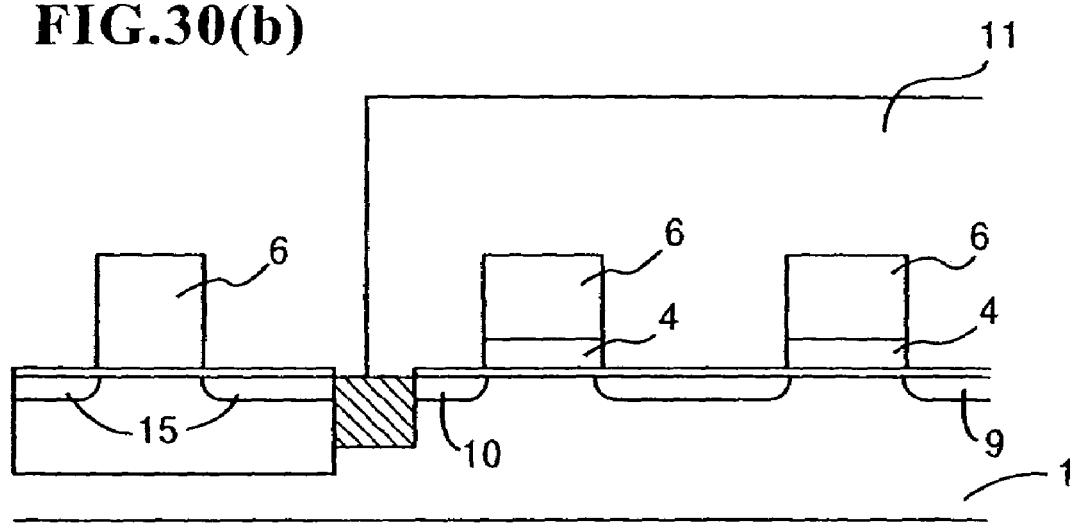

Next, referring to FIG. 30(*a*), the resist pattern (7) is formed in the shape of the gate electrode of the logic unit and flash memory unit based on a conventionally-known photolithographic method. Subsequently, the resist pattern (6) is etched based on a conventionally-known etching method by using said resist pattern (7) as a mask.

After the resist pattern (7) has subsequently been removed, the resist pattern (8) is formed based on a conventionally-known photolithographic method in such a way that it will blanket the logic unit.

Next, the polycrystalline silicon layer (4) of the flash memory unit is etched in a self-matching fashion by using the resist pattern (6), which has previously been processed into the shape of a gate electrode, as a mask based on a conventionally-known etching method. As a result, the polycrystalline silicon layer (4) assumes the shape of a floating gate. Incidentally, the logic unit remains unetched concomitantly in that it is being blanketed with the resist pattern (8).

Subsequently, an arsenic ion is implanted into the flash memory unit at a concentration of approximately $1\times10^{15}$ to $1\times10^{16}$ [ions/cm$^{-2}$] at 30 to 50 keV based on a conventionally-known ion implantation method while the resist pattern (8) and the prevailing state of the flash memory unit are being used as masks, as a result of which the source diffusion layer (9) and the drain diffusion layer (10) of the flash memory unit are formed.

When one wishes to form the source and drain impurity diffusion layers of the flash memory unit separately, an ion implantation operation may be carried out after a resist pattern which covers either the source or drain has been formed. As shown in FIG. 30(*b*).

Referring to FIG. 31(*a*), after the resist pattern (8) has been removed, the resist pattern (11) is formed in such a way that it will blanket the flash memory unit, and an arsenic ion is implanted into the source-drain region of the logic unit transistor at a concentration of approximately $1\times10^{13}$ to $1\times10^{14}$ [ions/cm$^{-2}$] at 30 to 50 keV based on a conventionally-known ion implantation method, as a result of which the LDD diffusion layer (12) is formed. Referring to FIG. 31(*b*), after the resist pattern (11) has been removed, a silicon oxide film whose thickness is approximately 100 nm is formed based on a conventionally-known CVD method, and subsequently, the side wall oxide film (13) is formed above it based on a conventionally-known etching method. Next, the resist pattern is formed based on a conventionally-known photolithographic method in such a way that it will blanket the flash memory unit, followed by the implantation of an arsenic ion into the source-drain region of the logic unit transistor at a concentration of approximately $1\times10^{15}$ to $3\times10^{15}$ [ions/cm$^{-2}$ at 10 to 50 keV based on a conventionally-known ion implantation method, as a result of which the logic unit source-drain diffusion layer (15) is formed. After the resist pattern has been removed, a thermal treatment is performed based on a conventionally-known annealing method within a temperature range of 850 to 1,000° C. for the purpose of diffusing and activating the impurity. When a high-temperature thermal treatment is thus performed preliminarily for the purpose of diffusing and activating the impurity, fears of damage to high-permittivity films and metal electrodes can be eliminated.

Next, the silicon oxide film (16), whose thickness is approximately 300 nm, is formed based on a conventionally-known CVD method.

Next, referring to FIG. 32(*a*), the surface of the silicon oxide film (13) is polished and flattened based on a conventionally-known CMP (chemical mechanical polish) method until the silicon nitride film (6) becomes bared.

Next, referring to FIG. 32(*b*), the silicon oxide film (13) is selectively removed by using a phosphoric acid solution based on a conventionally-known wet etching method, as a result of which the respective surfaces of the polycrystalline silicon layer (4) of the flash memory unit and the P-type semiconductor substrate (1) of the logic unit become bared.

The silicon oxide film whose thickness is approximately 2 nm is subsequently formed above the thus bared semiconductor substrate (1) based on a conventionally-known thermal oxidation method. In such a case, the oxidation rate of the polycrystalline silicon is approximately twice as high as that of the semiconductor substrate (monocrystalline silicon), and therefore, a silicon oxide film whose thickness is approximately 4 nm is formed above the polycrystalline silicon layer (4). Next, the Ta2O5 film (18), TiN film (19), and the W film (20) are formed at thicknesses of approximately 10 um, 50 nm, and 300 nm, respectively, based on a conventionally-known CVD method. The silicon oxide film serves as a buffer layer between the P-type semiconductor substrate (1) and the Ta2O5 film (20). The Ta2O5 film, furthermore, is a high-permittivity film whose specific permittivity is approximately 5 times as high as that of the silicon oxide layer. The TiN film (19) serves as a barrier metal for the W film (20).

Figure 33A:
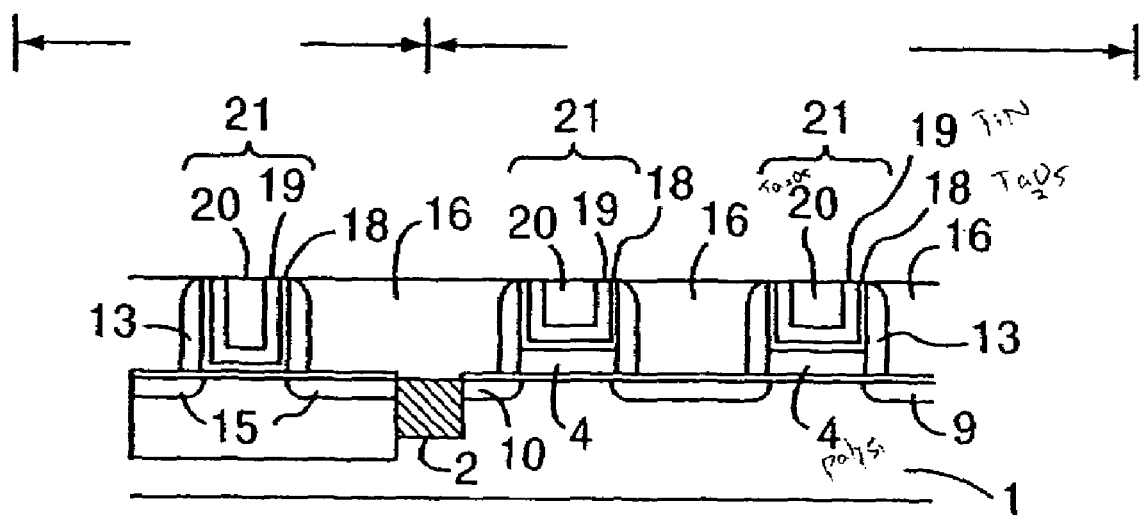
FIGS. 33(a)-33(b) are schematic demonstrational diagrams pertaining to the method for manufacturing a semiconductor device which complies with the fifth application embodiment of the present invention.

Incidentally, an SiON film, ON film, or ONO film may be hereby used in place of the silicon oxide film. When an SiON film is formed, a nitrogen ion is implanted into the semiconductor substrate (1) and polycrystalline silicon layer (4) based on a conventionally-known ion implantation method, and subsequently, the semiconductor substrate (1) is oxidized based on a conventionally-known thermal oxidation method. When an ON film is formed, the surface of the silicon oxide film may be nitrized based on a conventionally-known thermal nitrization method upon the formation of the silicon oxide film. When an ONO film is formed, a silicon nitride film may, for example, be formed based on a conventionally-known CVD method upon the formation of the silicon oxide film, followed by the oxidation of the surface of the silicon nitride film based on a conventionally-known thermal oxidation method. As shown in FIG. 33(a).

Figure 33B:
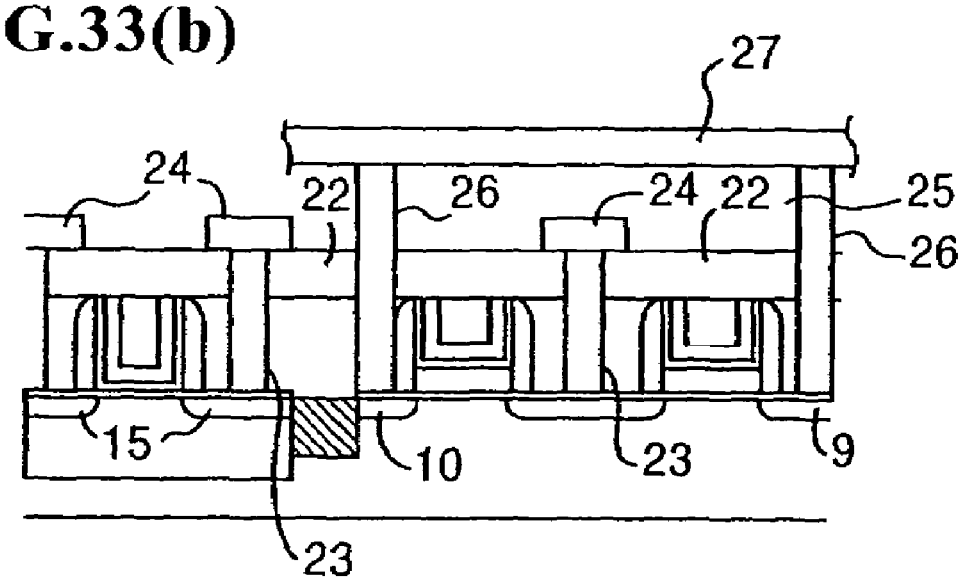

Next, the $Ta_2O_5$ film (18), TiN film (19), and the W film (20) are polished based on a conventionally-known CMP (chemical mechanical polish) method until the silicon oxide film (16) becomes bared, as a result of which the gate electrodes (21) are formed simultaneously on the logic unit and flash memory unit. Since the respective gate electrode heights of the flash memory unit and logic unit can be simultaneously leveled within a single process, subsequent flattening processes become unnecessary. As shown in FIG. 33(b).

After the interlayer insulating film (22) has subsequently been formed uniformly, the contact window (23) is opened, followed by the patternwise formation of the wire layer (24). Next, the interlayer insulating film (25) is formed blanketwise in such a way that it will cover the wire layer, followed by the opening of the contact window (26). The wire layer (27) is formed via the contact window (26). An upper insulating film (not shown in the figure), etc. is further formed, as a result of which a finished flash memory-logic unit heterogeneously mounted semiconductor device structure is obtained.

The gate insulating film thickness of the logic unit transistor, which can be expressed by the sum of the silicon oxide film and $Ta_2O_5$ film (18), is (2+10=) 12 nm, but since the specific permittivity of the $Ta_2O_5$ is approximately 5 times as high as that of the silicon oxide film, the total film thickness based on the oxide film standard is (2+10/5=) 4 nm.

In other words, an insulating film capacitance comparable to that of a 4 rim silicon oxide film can be achieved at a film thickness of 12 nm, and therefore, a structure which is more resistant to deteriorations of transistor performances attributed to leak currents than a structure wherein a silicon oxide film is used alone can be realized.

Regarding the thickness of the floating gate-control gate gap insulating film of the flash memory unit, on the other hand, the oxidation rate of polycrystalline silicon is approximately twice as high as that of the semiconductor substrate (1) (monocrystalline silicon), and therefore when a 2 nm silicon oxide film is formed above the semiconductor substrate (1), the thickness of the silicon oxide film (17) above the polycrystalline silicon layer (4) becomes approximately 4

In other words, the total thickness of the silicon oxide film and the $Ta_2O_5$ film (18) is (4+10=) 14 nm, whereas the thickness based on the oxide film standard becomes (4+10/5=) 6 nm (the thickness of the floating gate-control gate gap insulating film thus becomes greater than the thickness of the gate insulating film of the logic unit transistor, but there is no need to reduce its thickness to a magnitude comparable to that of said gate insulating film of the logic unit transistor; on the contrary, this lopsidedness is preferred in consideration of data retention requirements for the flash memory).

When a silicon nitride film is used in place of the aforementioned $Ta_2O_5$ film (18), on the other hand, the specific permittivity of the silicon nitride film is approximately twice as high as that of the silicon oxide film, and therefore, the film thickness based on the oxide film standard becomes (4+10/2=) 9 nm.

In other words, an insulating film capacitance comparable to that of a 6 nm silicon oxide film or 9 nm ON film can be realized at a film thickness of 14 nm.

When the $C_1$ (capacitance between the floating gate and control gate) at a given film thickness is probed, the following formula can be ascertained with regard to $C_1(SiO_2)$, which is imputed specifically to a 14 nm silicon oxide film:

$$C_1(SiO_2)=\epsilon 0 \times \epsilon_{SiO2} \times S/d \qquad (0).$$

When $\epsilon 0$ is defined as the vacuum permittivity, $\epsilon_{SiO2}$ as the specific permittivity of the silicon oxide film, S as the contact area between the floating gate and control gate, and d as the thickness of the insulating film between the floating gate and control gate electrode, which, in this embodiment, is 14 nm, the formula (0) can be rephrased as follows:

$$C_1(SiO_2)=\epsilon 0 \times \epsilon_{SiO2} \times S/14 \qquad (1).$$

Since the thickness of the 14 nm ON film based on the oxide film standard is 9 nm according to the aforementioned rationale, the following can be ascertained:

$$C_1(ON)=\epsilon 0 \times \epsilon_{SiO2} \times S/9 \qquad (2).$$

Based on (1) and (2), furthermore, the following can be ascertained:

$$C_1(ON)=C_1(SiO_2) \times 14/9 = C_1(SiO_2) \times 1.56.$$

In contrast, the combined thickness of the aforementioned silicon oxide film (17) and $Ta_2O_5$ film (18) based on the oxide film standard are 6 nm, and therefore, the following can be ascertained:

$$C_1(ON)=\epsilon 0 \times \epsilon_{SiO2} \times S/6 \qquad (3).$$

Based on (1), (2), and (3), furthermore, the following can be ascertained:

$$C_1(SiO_2+Ta_2O_5)=C_1(SiO_2) \times 14/6=C1(SiO_2) \times 2.33=C1(ON) \times 9/6=C1(SiO_2) \times 1.50.$$

As has been mentioned above, the $C_1$ value of the flash memory unit can be raised (i.e., higher coupling ratio) in comparison with the prior art, and accordingly the magnitude of the voltage impressed on the control gate can be lowered.

One of the NOR types has been employed as the memory cell of the flash memory unit of the aforementioned application example, although it should be obvious that all non-volatile memories obtained by laminating floating gates and control gates can be effectively used.

TiN has, furthermore, been used as the barrier metal for the gate electrode, but it is also possible to use silicide films or metal films which include W, Mo, Ti, Ta, etc. as well as electroconductive films whose compositions are based on their combinations.

The gate electrode, furthermore, is not limited to W, and it is also possible to use metal films which include Al, Cu, etc.

Logic unit Nch transistors alone have, furthermore, been demonstrated in the aforementioned application examples, but it should be apparent that Pch transistors are equally effective so long as the types of impurity ions, etc. are optimized.

The silicon nitride film (6), side wall oxide film (13), and the silicon oxide film (16) of the aforementioned application example may, furthermore, be substituted with other films so long as the combinations of insulating films which are capable of selectively removing either in maskless fashion are selected.

Figure 1A:
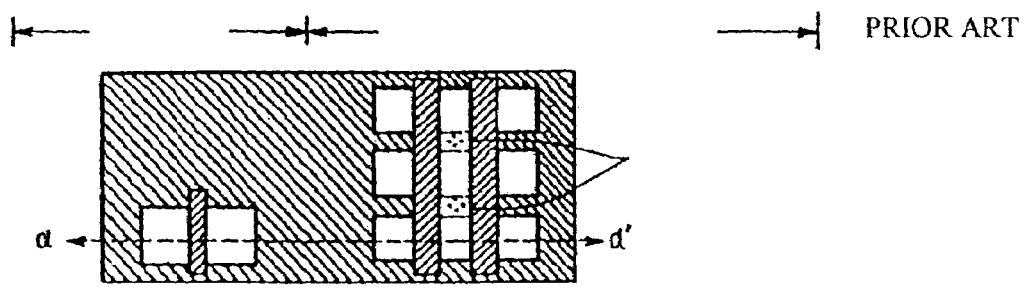
FIGS. 1(a)-1(d) are schematic demonstrational diagrams pertaining to a method for manufacturing a flash memory of the prior art.
Figure 1B:
Figure 1C:
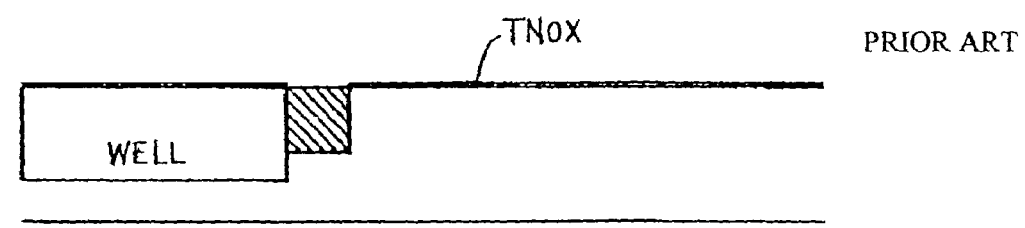
Figure 1D:
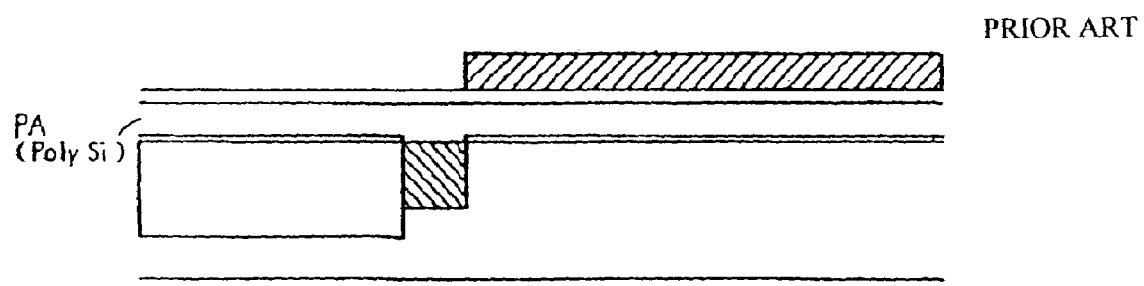
Figure 2A:
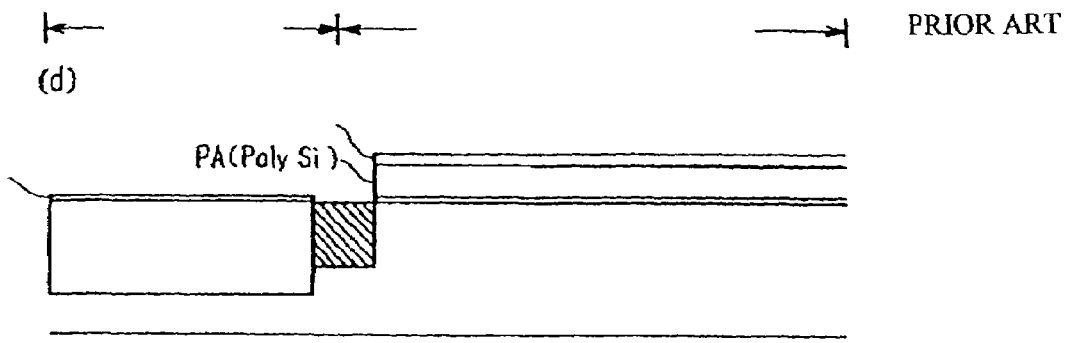
FIGS. 2(a)-2(c) are schematic demonstrational diagrams pertaining to the method for manufacturing a flash memory of the prior art.
Figure 2B:
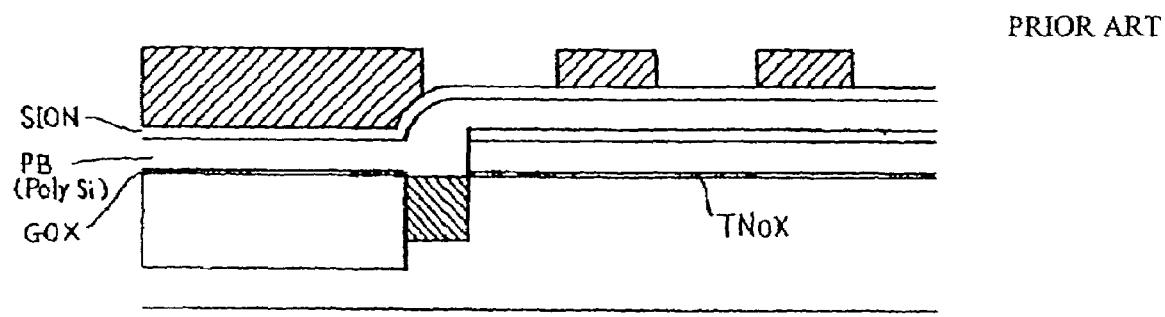
Figure 2C:
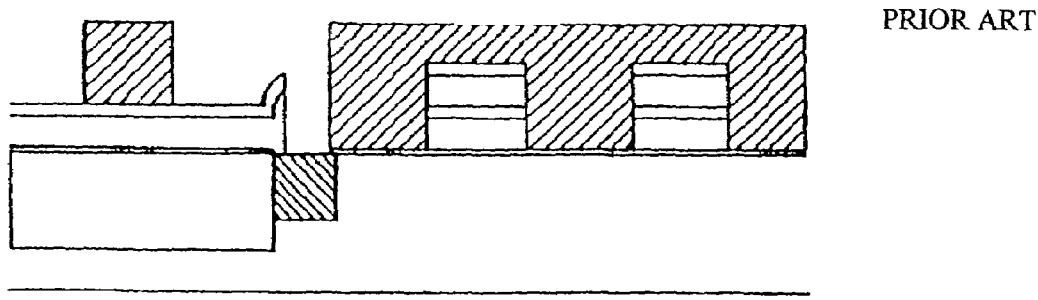
Figure 3A:
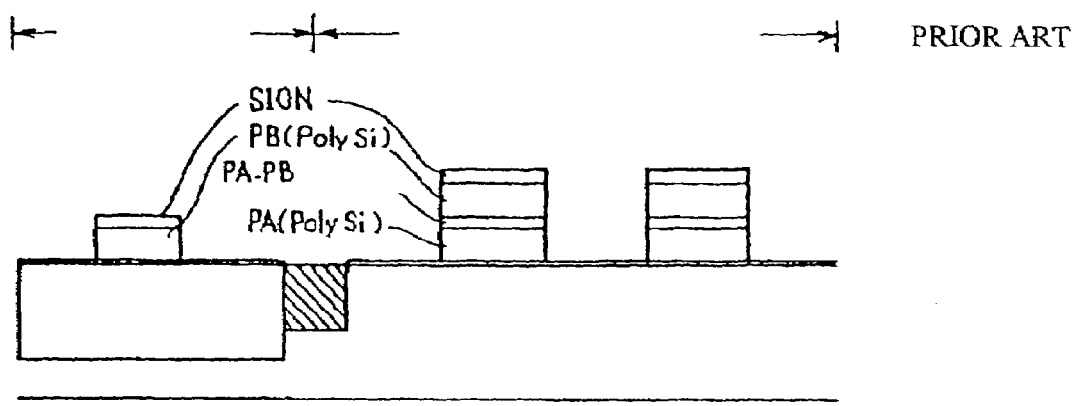
FIGS. 3(a)-3(c) are schematic demonstrational diagrams pertaining to the method for manufacturing a flash memory of the prior art.
Figure 3B:
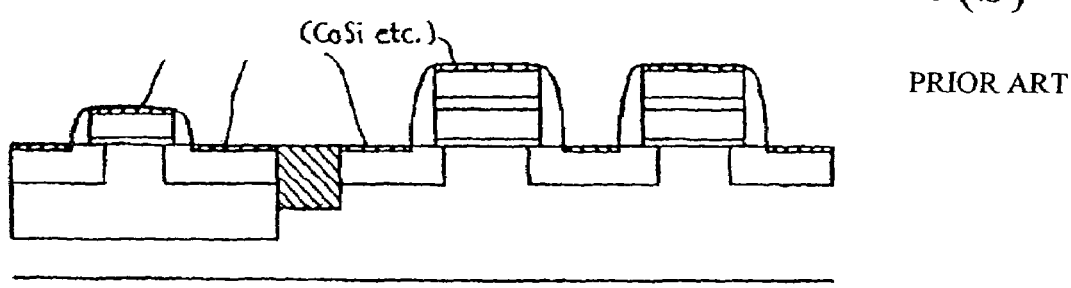
Figure 3C:
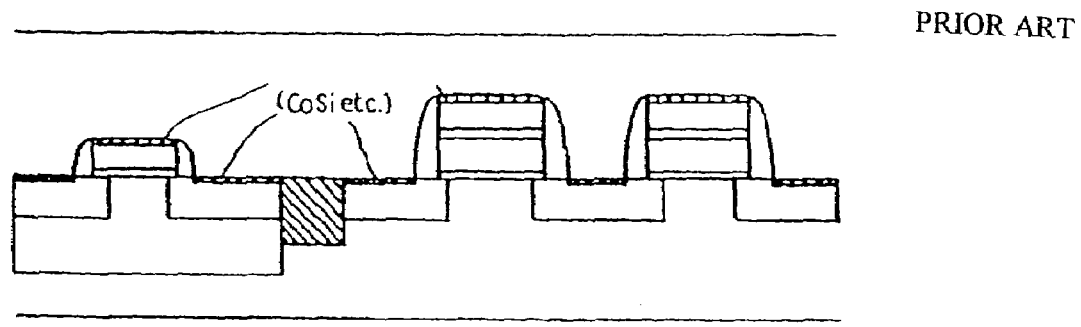

When material combinations are swapped, namely when a silicon oxide film is employed in place of the silicon nitride film (6) and when silicon nitride films are employed respectively as the side wall oxide film (13) and silicon oxide film (16), for example, the resist pattern (7) alone may be selectively removed by using a hydrofluoric acid solution in FIG. 1 and FIG. 2.

Either film may, furthermore, be removed selectively by means of dry etching instead of wet etching so long as a sufficient etching selection ratio can be secured.

A simpler polymetal gate structure may, furthermore, be postulated as an advanced version of the fifth application embodiment.

Initial processes are completely identical to the processes (a) through (1) graphically shown in FIGS. 27(a) through 32(a), and the previous explanations of the fifth application example should be referred to in this context, for they will not be reiterated. In the following, therefore, the processes which follow the process shown in FIG. 32(a) will be explained.

Figure 32A:
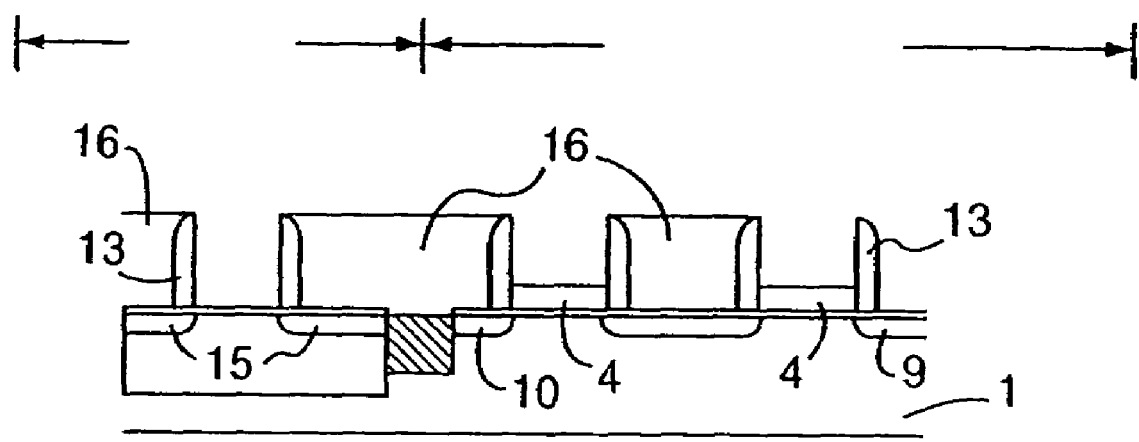
FIGS. 32(a)-32(b) are schematic demonstrational diagrams pertaining to the method for manufacturing a semiconductor device which complies with the fifth application embodiment of the present inventions
Figure 32B:
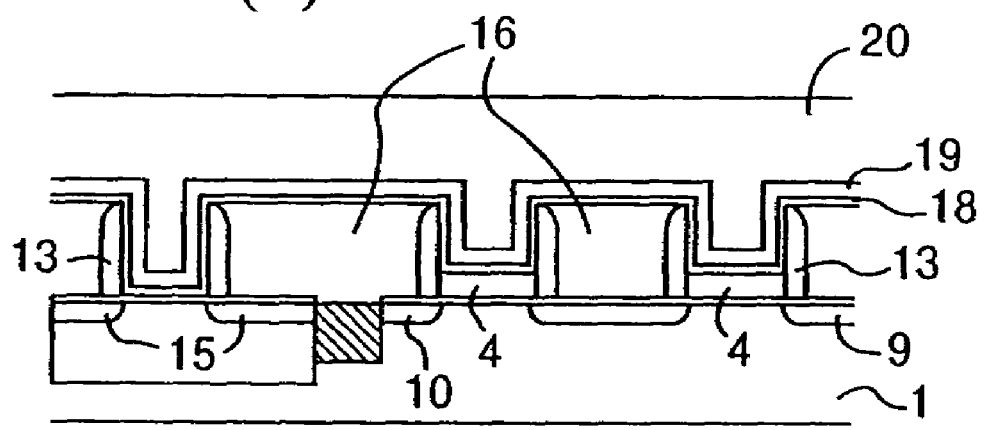

A laminate film is formed on a gate electrode formation planned region for simulating the structure formed in the process shown in FIG. 32(b), and after a coating film has been deposited on it, the surface of the gate electrode is planarized based on a CMP (chemical mechanical polish) method. In other words, the respective processes of the fifth application example are fundamentally repeated with the exception of the process for forming a gate electrode, and the processes before and after this one may be completely identical.

To explain in further detail, the silicon oxide film (31), whose thickness is approximately 5 nm, is formed above the semiconductor substrate (1), which has been bared by a conventionally known thermal oxidation method. A silicon oxide film whose thickness is approximately 10 nm is concomitantly formed above the polycrystalline silicon layer (4) in that the oxidation rate of the polycrystalline silicon is twice as high as that of the semiconductor substrate (monocrystalline silicon). It is also possible to hereby use an SiON film, ON film, or ONO film in place of the silicon oxide film.

When an SiON film is formed, for example, a nitrogen ion is implanted into the semiconductor substrate (1) and polycrystalline silicon layer (4) based on a conventionally-known ion implantation method, followed by the oxidation of the semiconductor substrate (1) based on a conventionally-known thermal oxidation method. In the case of an ON film, furthermore, the silicon oxide film is first formed, and the surface of said silicon oxide film is nitrized based on a conventionally-known thermal nitrizing method. In the case of an ONO film, furthermore, a silicon nitride film is formed based on a conventionally-known CVD method upon the formation of the silicon oxide film, followed by the oxidation of said silicon oxide film based on a conventionally-known thermal oxidation method. Next, the polycrystalline silicon film (32), whose thickness is approximately 50 nm and which includes $2 \times 6 \times 10^{20}$ [atoms/cm$^2$] of phosphorus, is formed based on a conventionally-known CVD method. When an N-type polycrystalline silicon and a P-type polycrystalline silicon are separately and respectively formed in the Nch transistor region and the Pch transistor region, furthermore, the work function differential vis-a-vis the semiconductor substrate can be hereby moderated. In order to achieve this goal, a non-doped polycrystalline film whose thickness is approximately 50 nm is formed in place of the aforementioned polycrystalline silicon film (32). Next, a phosphorus ion is implanted into the aforementioned non-doped polycrystalline film at a concentration of approximately $1 \times 10^{15}$ to $5 \times 10^{15}$ [ions/cm$^{-2}$] at 10 to 20 KeV based on a conventionally-known ion implantation method while the Pch transistor region of the logic unit is being masked by a resist pattern. Next, a boron ion is implanted into the aforementioned non-doped polycrystalline film at a concentration of approximately $1 \times 10^{15 \times 5 \times 10^{15}}$ [ions/cm$^{-2}$] at 1 to 10 KeV based on a conventionally-known ion implantation method while the areas other than the Pch transistor region of the logic unit are being masked by a resist pattern. Subsequently, a thermal treatment is performed at 850 to 1,000° C. based on a conventionally-known annealing method for the purpose of diffusing and activating the impurities. Next, the TiN film (33) and the W film (34), whose respective thicknesses are approximately 50 ELM and 30 um, are formed based on a conventionally-known annealing method. Next, the polycrystalline silicon film (32), TIN film (33), and the W film (34) are polished based on a conventionally-known CMP (chemical mechanical polish) method until the silicon oxide film (16) becomes bared, as a result of which gate electrodes (45) with an identical height are simultaneously formed on the logic unit and the flash memory unit. The subsequent process is identical to the process which has been discussed in detail above and a corresponding cross-sectional view of which is shown in FIG. 33.

In, the following, the sixth application embodiment of the present invention will be explained with reference to FIG. 34. FIG. 34 is a demonstrational diagram pertaining to the manufacturing processes of the semiconductor device of the sixth application embodiment of the present invention based on the damascene gate technique (cross-sectional View of the device), where a cross-sectional view of a single transistor of the logic device region is shown to the left of each figure, whereas a cross-sectional view of two cell transistors of the flash memory region are shown on the right of each representation. The respective processes are individually shown. The sixth application example represents a case where an attempt is made to lower the source-drain diffusion layer resistance by integrating a salicide (self-aligned silicide) technique with the method far manufacturing the semiconductor device of the present invention.

The respective processes of the initial phase of the sixth application example (processes shown in FIGS. 27(a) through 31(a) are identical to their counterparts of the fifth application example, and therefore, their explanations will not be reiterated. In the following, therefore, the respective processes which follow the process shown in FIG. 31(b) will be explained in proper order.

Figure 34A:
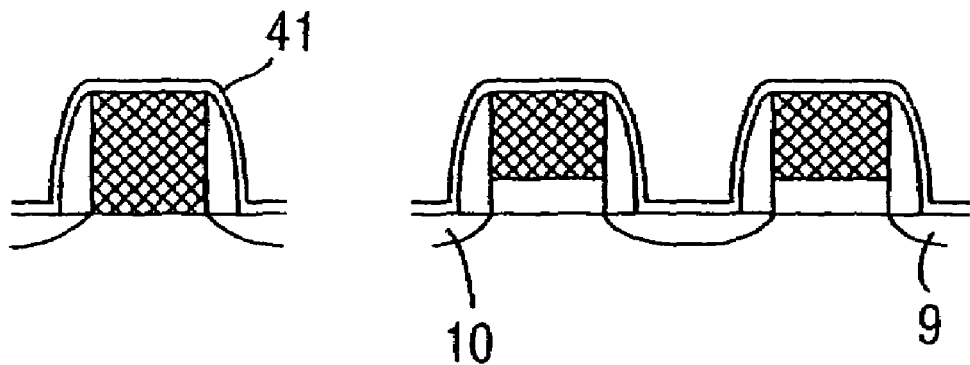
FIGS. 34(a)-34(c) are schematic demonstrational diagrams pertaining to the method for manufacturing a semiconductor device which complies with the sixth application embodiment of the present invention.
Figure 34B:
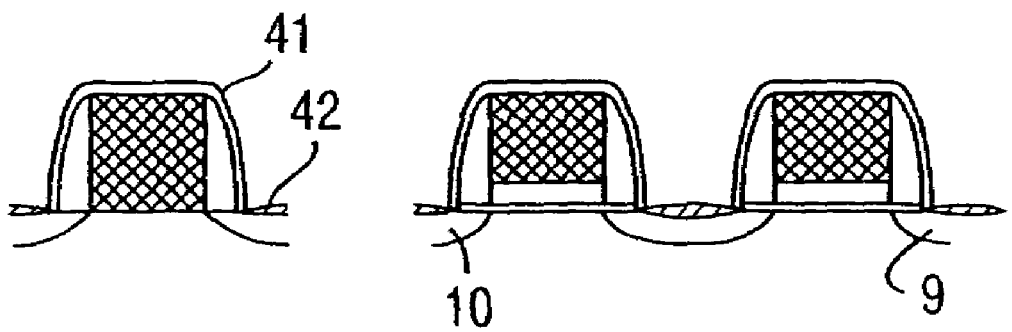

Referring to FIG. 34(b), after the resist pattern has been removed, a thermal treatment is performed at 850 to 1,000° C. based on a conventionally-known annealing method for the purpose of diffusing and activating the impurity, and the Ti (titanium) [film] (41), whose thickness ranges from 3 to 6 nm, is formed over the entire plane of the remainder of the structure based on a conventionally-known sputtering method.

Figure 34C:
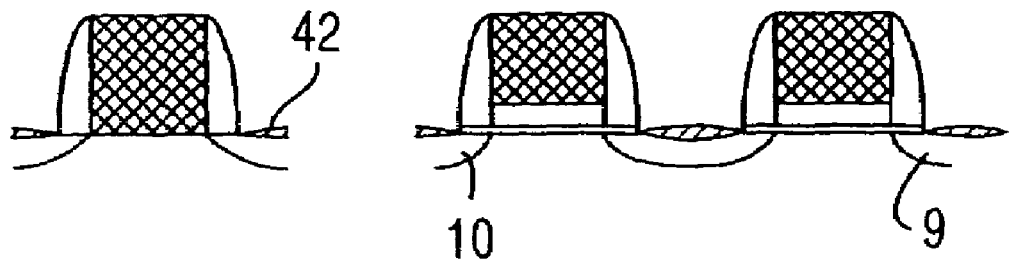

Next, referring to FIG. 34(c), a thermal treatment is performed at 600 to 700° C. based on a conventionally-known annealing method, as a result of which said Ti and the Si of the semiconductor substrate (1) become reacted, and the Ti silicide layer (TiSi2) (42) is formed.

After the Ti outside the Ti silicide layer has subsequently been removed based on a conventionally-known wet etching method, a thermal treatment is performed at 600 to 800° C. based on a conventionally-known annealing method for the purpose of lowering the resistance of the silicide layer.

Low-resistance silicide layers are thus formed only on the logic unit source-drain (12), flash memory unit source (9), and the drain (10).

Figure 31A:
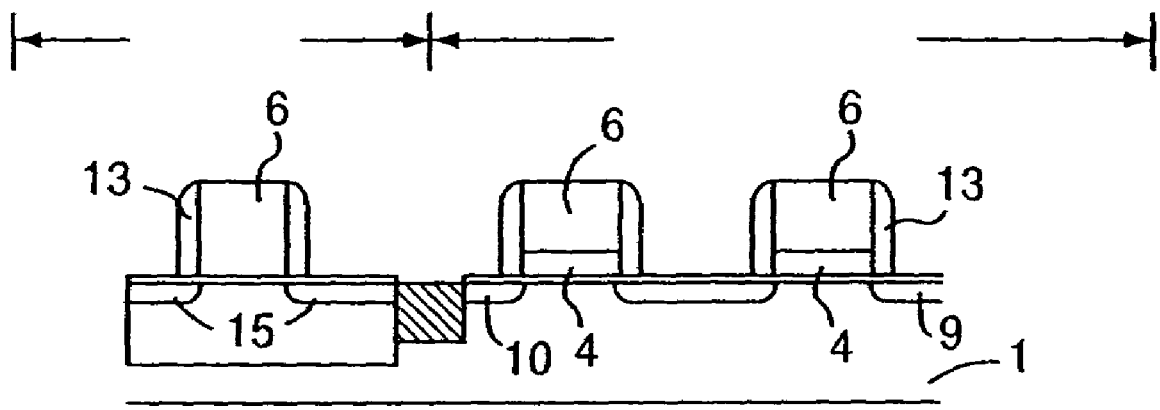
FIGS. 31(a)-31(b) are schematic demonstrational diagrams pertaining to the method for manufacturing a semiconductor device which complies with the fifth application embodiment of the present invention.
Figure 31B:
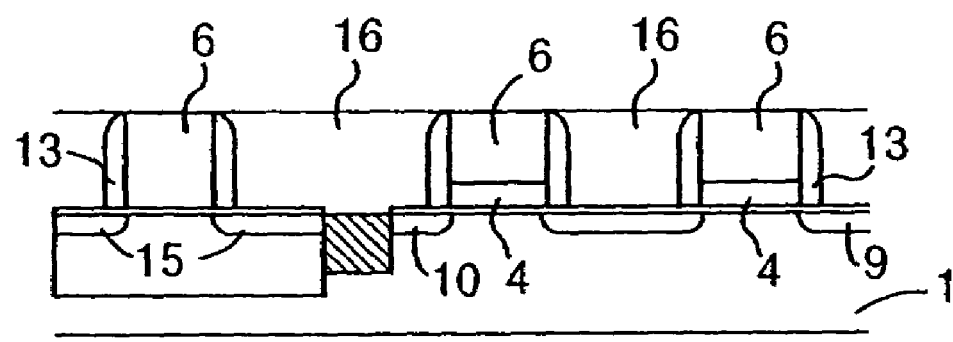

The subsequent processes are identical to the corresponding processes and beyond of the fifth application example shown in FIG. 31(b), When the aforementioned processes, shown in FIGS. 34(a)-34(c) are additionally implemented, the resistances of the respective source-drain diffusion layers of the logic unit and flash memory cell region can be lowered, based on which the performances can be further improved.

The Ti of the aforementioned application example may also be substituted with another metal which can form a silicide with Si (e.g., Co, Pt, Ni, etc.).

Regarding each of the aforementioned application embodiments, furthermore, an insulating film which has been temporarily formed over the entire plane is etched back until the substrate plane becomes bared in the context of forming side wall films, as a result of which the finished side wall films become completely severed from the substrate plane. The present invention, however, is not limited to such isolated side wall films, and it is also possible to form a side wall film which is characterized by a tapered shape vis-à-vis the substrate plane (i.e., formation of a side wall which is not completely severed from the substrate plane) for achieving similar effects. In such a case, a coating film which blankets the side wall film of the memory cell region and the source-drain region can be induced to remain by using as a mask a pattern which blankets said memory cell region and which possesses an opening corresponding to a peripheral region. When such a coating film is induced to remain, effects of obstructing the entrenchment of the silicidation of the peripheral transistor into the memory cell region (i.e., selective silicidation) and of preventing damages attributed to the implantations of source-drain ions can be expected.

In addition to the respective embodiments discussed above, various other versions of the present invention which can be expected to yield auxiliary functions and effects are conceivable.

EFFECTS OF THE INVENTION

As the foregoing explanations have demonstrated, when a non-volatile semiconductor memory sell device is formed according to the present invention, a single-gate CMOS Tr. and a non-volatile memory Tr. which possesses a floating gate can be mounted together in the context of manufacturing a heterogeneously memory-mounted LSI by utilizing a damascene metal gate process. A countermeasure against a Tr. gate depletion that would otherwise accompany an elevated peripheral transistor speed is thus provided for this non-volatile surface memory device, based on which the gate resistance gain can be inhibited at a minimum while the thickness of the gate oxide film is being reduced. Based on the optimization of the gate electrode constitution of the non-volatile memory cell region, furthermore, effects of lowering the gate resistance and of improving the memory cell reliability can be achieved, whereas when the constitution of a PA (first wire layer)-PB (second wire layer) gap insulating film is optimized, the coupling ratio can be improved, based on which the data encoding and erasure performances of the non-volatile memory cell can accordingly be improved.

What is claimed:

1. A method for manufacturing a semiconductor device, said method comprising the following steps: (a) a step whereby a dummy gate pattern which consists of multiple layers and which possesses a first electroconductive layer as the lowermost layer is formed on a memory cell region and a peripheral transistor region which has been defined above a semiconductor substrate, (b) a step whereby a coating film which covers said dummy gate pattern is formed; (c) a step whereby said coating film is dry-etched in such a way that a gate side wall film will selectively remain on the side plane of said dummy gate pattern; (d) a step whereby an interlayer insulating film is formed blanketwise on the remainder of the structure formed through the preceding processes; (e) a step whereby the surface of said interlayer insulating film is etched back based on the chemical mechanical polish method until the surface of said intermediate insulating film and the surface of said dummy gate pattern become virtually continuous and flat; (f) a step whereby said dummy gate pattern is partially removed in such a way that said dummy gate pattern will be removed from said peripheral transistor region but will remain in said memory cell region and that said gate side wall film will remain in both said memory cell region and said peripheral transistor region; (g) a step whereby a second electroconductive layer is formed blanketwise on the remainder of the structure which has been formed through the preceding processes and which includes the region from which said dummy gate pattern has been removed; and (h) a step whereby the surface of said interlayer insulating film is etched back based on the chemical mechanical polish method until the surface of said interlayer insulating film and the surface of said second electroconductive layer become virtually continuous and planarized.

2. The method for manufacturing a semiconductor device according to claim 1, wherein a film which possesses an upper silicon layer and a lower silicon layer which sandwich an insulating film is formed as said dummy gate pattern in said process (a), and wherein said step (e) is implemented in such a way that said insulating film will remain and that said upper silicon layer will be removed.

3. The method for manufacturing a semiconductor device according to claim 1, furthering comprising the step of: a process whereby an intermediate insulating film is formed above said first electroconductive layer between sad steps (e) and (f).

* * * * *